(12) United States Patent
Varnica et al.

(10) Patent No.: US 8,392,809 B1
(45) Date of Patent: Mar. 5, 2013

(54) LOG-LIKELIHOOD-RATIO (LLR) TABLE CALIBRATION

(75) Inventors: Nedeljko Varnica, Sunnyvale, CA (US); Seo-How Low, San Jose, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 327 days.

(21) Appl. No.: 12/901,357

(22) Filed: Oct. 8, 2010

Related U.S. Application Data

(60) Provisional application No. 61/252,500, filed on Oct. 16, 2009.

(51) Int. Cl.
*H03M 13/03* (2006.01)

(52) U.S. Cl. .................... 714/794; 714/763; 365/185.03

(58) Field of Classification Search .................. 714/794, 714/763; 365/185.03
See application file for complete search history.

(56) References Cited

U.S. PATENT DOCUMENTS

| | | | |
|---|---|---|---|
| 2010/0165730 A1* | 7/2010 | Sommer et al. .......... | 365/185.03 |
| 2010/0192042 A1* | 7/2010 | Sharon et al. ................. | 714/763 |
| 2011/0305082 A1* | 12/2011 | Haratsch et al. ......... | 365/185.03 |

* cited by examiner

*Primary Examiner* — Sam Rizk

(57) ABSTRACT

Some of the embodiments of the present disclosure provide a system, device and a method performing N read cycles on a plurality of memory cells of a memory sector, wherein N is an integer greater than one; constructing (N+1) bin histograms based at least in part on performing the N read cycles; identifying a shortest bin histogram of the (N+1) bin histograms; and based on a height of the shortest histogram, assigning a log-likelihood ratio (LLR) to the shortest bin histogram. Other embodiments are also described and claimed.

20 Claims, 18 Drawing Sheets

Rule 1 (Assignment rule 1 for the shortest bin histogram): During a read cycle in the recovery mode, (i)    if the shortest bin histogram is less than a threshold number, assign a zero LLR (which corresponds to a label of 0, as illustrated in table 500) to the shortest bin histogram; or (ii)    if the shortest bin histogram is greater than a threshold number, assign a non-zero LLR (e.g., label 0−, label 0+, or the like) to the shortest bin histogram based at least in part on Rule 2.

Fig. 7

Rule 2 (Assignment rule 2 for the shortest bin histogram): During a read cycle in the recovery mode, if the shortest bin histogram is greater than a threshold number, assign a non-zero LLR (e.g., with label 0−, label 0+, etc.) based on any one of the following criteria:

(i)    assign a non-zero LLR to the shortest bin histogram, where a magnitude of the assigned non-zero LLR (i.e., whether a label comprising a zero and a sign, only one sign, two signs, etc.) is based on the height of the shortest bin, and where a sign of the non-zero LLR (e.g., sign of the associated label) is assigned based on a sign of the immediate neighboring bin histogram that is taller among the two immediate neighboring bin histograms; or (ii)    assign a non-zero LLR to the shortest bin histogram, where a magnitude of the assigned non-zero LLR is based on the height of the shortest bin, and where a sign of the non-zero LLR is assigned based on a comparison of (A) a number of bin histograms to the left of the shortest bin histogram, and (B) a number of bin histograms to the right of the shortest bin histogram.

Fig. 8

Rule 3 (Splitting rule for splitting the shortest bin histogram): If (A) decoding fails during a read cycle in the recovery mode, and/or (B) if the shortest bin histogram is greater than the threshold number, then perform another read cycle with a new threshold voltage, where the new threshold voltage splits the shortest bin histograms into two new bin histograms.

Fig. 9

Rule 4 (Splitting rule for splitting an immediate neighboring bin histogram): If (A) decoding fails during a read cycle in the recovery mode, and/or (B) if the shortest bin histogram is shorter than the threshold number, then perform another read cycle with a new threshold voltage, where the new threshold voltage splits one of the two immediate neighboring bin histograms of the shortest bin histogram based on a suitable criterion (e.g., a criterion based on Rule 5)

Fig. 10

Rule 5 (Splitting rule for splitting an immediate neighboring bin histogram):
(i) Perform another read cycle with a new threshold voltage, where the new threshold voltage splits one of the two immediate neighboring bin histograms of the shortest bin histogram based on, for example, a comparison of heights of the two immediate neighboring bin histograms of the shortest bin histogram; and/or
(ii) If there is only one bin histogram to the left or right of the shortest bin, perform another read cycle with a new threshold voltage and split the only one bin histogram.

Fig. 11

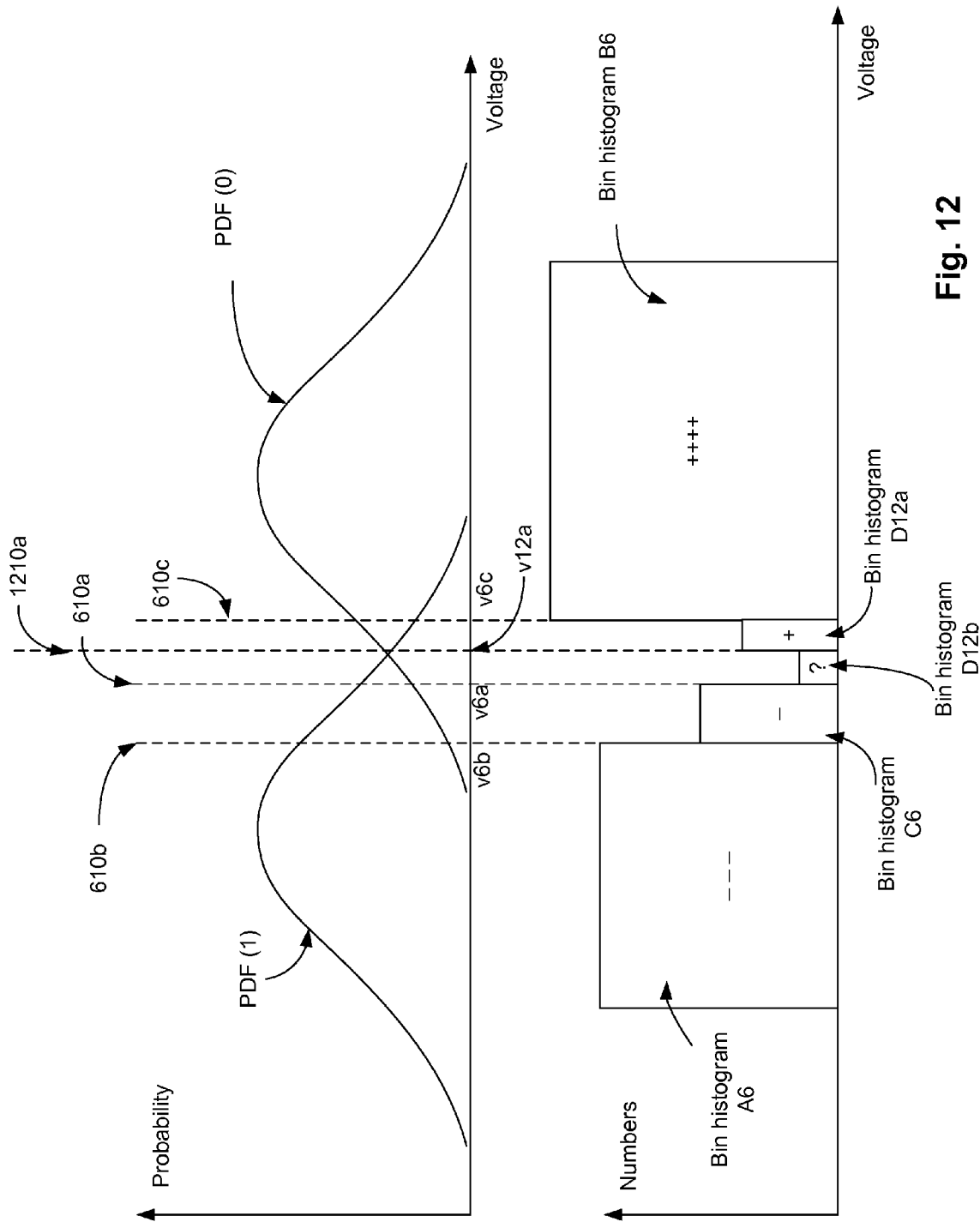

Rule 6 (Assignment rule for bin histograms that are immediate neighbors of the shortest bin histograms):

(i) Assign, to bin histograms that are immediate neighbors of the shortest bin histogram, LLRs based on the heights of the immediate neighboring bin histograms;

or (iia) If an immediate neighboring bin histogram of the shortest bin histogram is relatively very tall compared to the shortest bin histogram, assign a relatively small LLR to the immediate neighboring bin histogram; and/or (iib) If there is only one bin histogram to the left or right of the shortest bin, assign a relatively small LLR to the only one bin histogram.

Fig. 14

LOG-LIKELIHOOD-RATIO (LLR) TABLE CALIBRATION

CROSS REFERENCE TO RELATED APPLICATIONS

The present application claims priority to U.S. Patent Application No. 61/252,500, filed Oct. 16, 2009, the entire specification of which is hereby incorporated by reference in its entirety for all purposes, except for those sections, if any, that are inconsistent with this specification.

TECHNICAL FIELD

Embodiments of this disclosure relate to log-likelihood ratio (LLR) tables in general, and more specifically, to calibration of log-likelihood ratio (LLR) tables.

BACKGROUND

The background description provided herein is for the purpose of generally presenting the context of the disclosure. Work of the presently named inventor, to the extent it is described in this background section, as well as aspects of the description that may not otherwise qualify as prior art at the time of filing, are neither expressly nor impliedly admitted as prior art against the present disclosure.

In a memory (data storage) system, data is usually encoded using an appropriate encoder. Encoded data is written in a memory, and the written data is read from the memory at a later time. The read data can be corrupted by, for example, error during the write, retention and/or read operations.

A read operation (e.g., a read operation in systems with soft decoding algorithms) usually involves estimating soft information such as log-likelihood ratios (LLR) for data bits read from the memory. The LLRs are indicative of a confidence in zero ('0') or one ('1') for each data bit read from the memory. A decoder decodes the data based on the estimated LLRs for the data bits. Estimation of LLRs directly affects the decoder performance, and the performance of the memory system.

SUMMARY

In various embodiments, the present disclosure provides a method comprising performing N read cycles on a plurality of memory cells of a memory sector, wherein N is an integer greater than one; constructing (N+1) bin histograms based at least in part on performing the N read cycles; identifying a shortest bin histogram of the (N+1) bin histograms; and based on a height of the shortest histogram, assigning a log-likelihood ratio (LLR) to the shortest bin histogram. There is also provided a memory system comprising a memory comprising a plurality of memory sectors, each sector including a plurality of memory cells; a read module comprising a log-likelihood ratio (LLR) determination module; and an iterative decoder; wherein the LLR module is configured to perform N read cycles on the plurality of memory cells of a first memory sector, wherein N is an integer and is greater than one, construct (N+1) bin histograms based at least in part on performing the N read cycles, identify a shortest bin histogram of the (N+1) bin histograms, and assign an LLR to the shortest bin histogram based at least in part on a height of the shortest bin histogram. There is also provided a method comprising performing N read cycles on a plurality of memory cells of a memory sector, wherein N is an integer and is greater than one, constructing (N+1) bin histograms based at least in part on performing the N read cycles; identifying a shortest bin histogram of the (N+1) bin histograms; attempting to decode data bits associated with the plurality of memory cells, based at least in part on constructing the (N+1) bin histograms; in response to a failure in decoding the data bits and if a height of the shortest bin histogram is larger than a threshold number, performing a (N+1)th read cycle on the plurality of memory cells such that a (N+1)th threshold voltage level, associated with the (N+1)th read cycle, splits the shortest bin histogram.

BRIEF DESCRIPTION OF THE DRAWINGS

In the following detailed description, reference is made to the accompanying drawings which form a part hereof wherein like numerals designate like parts throughout, and in which is shown by way of illustration embodiments in which the teachings of this disclosure may be practiced. It is to be understood that other embodiments may be utilized and structural or logical changes may be made without departing from the scope of this disclosure. Therefore, the following detailed description is not to be taken in a limiting sense, and the scope of embodiments in accordance with the present disclosure is defined by the appended claims and their equivalents.

FIGS. 7-11 and 14 illustrate various rules for assigning LLRs to bin histograms and/or for splitting a bin histogram during a read cycle.

FIG. 12 schematically illustrates bin histograms corresponding to three read cycles of FIG. 6, along with another read cycle with a new threshold voltage.

DETAILED DESCRIPTION

Various operations may be described as multiple discrete operations in turn, in a manner that may be helpful in understanding embodiments of the present disclosure; however, the order of description should not be construed to imply that these operations are order dependent.

The description may use the phrases "in an embodiment," or "in embodiments," which may each refer to one or more of the same or different embodiments. The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

Figure 1:
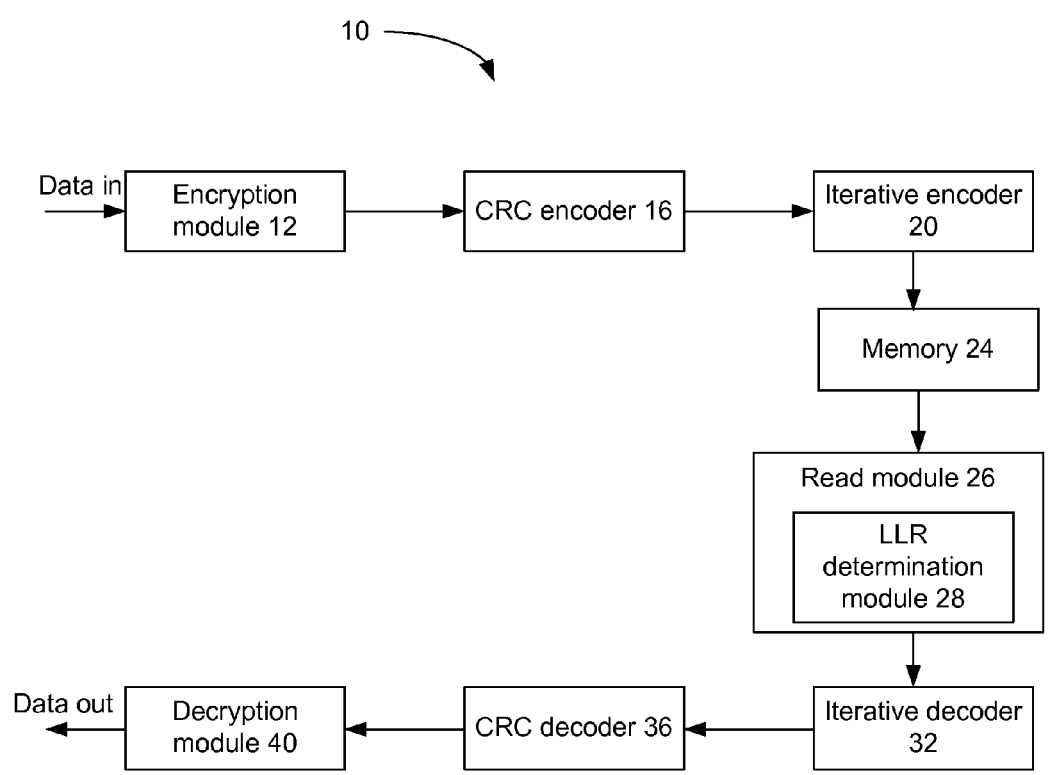
FIG. 1 schematically illustrates an example of a memory system.

FIG. 1 schematically illustrates an example of a memory system 10. The memory system 10 receives data, labeled as "data in" in FIG. 1, and writes the received data in a memory 24. The memory 24 is any appropriate type of memory, e.g., a volatile memory (e.g., an appropriate type of random-access memory), a non-volatile memory (e.g., a read-only memory, a flash memory, a hard disk, a compact disk (CD)), or the like.

Before the received data is written in the memory 24, the received data is encrypted using an encryptor 12, is encoded using a cyclic redundancy check (CDC) encoder 16, and/or is further encoded using an iterative encoder 20. In various embodiments, the encryptor 12 and/or the CRC encoder 16 are not present in the memory system 10. Data written in the memory 24 is read by a read module 26, which includes a log-likelihood ratio (LLR) determination module 28. An iterative decoder 32 receives an output of the read module 26, and decodes the received data, which is further decoded using a CRC decoder 36. A decryption module 40 decrypts the decoded data received from the CRC decoder 36, and outputs the decrypted data (labeled as "data out" in FIG. 1).

In various embodiments, the memory 24 is an electrically-erasable programmable read-only memory (EEPROM), e.g., a flash memory. Although not illustrated in FIG. 1, the memory 24 includes a plurality of memory sectors, where each memory sector includes a plurality of memory cells, with each memory cell storing one or more bits of data (e.g., based on whether the memory cells are single-level cells (SLCs) or a multi-level cells (MLCs)). In various embodiments, data is read from the memory 24 in the unit of sectors. That is, data bits from memory cells of a memory sector of the memory 24 are read during a single read cycle.

During a read cycle, the read module 26 applies a threshold voltage to individual memory cells of a memory sector. For a given memory cell, the read module 24 determines whether a voltage level of the memory cell is higher or lower compared to the applied threshold voltage. Based on this determination, the read module 26 estimates whether a bit zero or a bit one is stored in the memory cell. Thus, a read cycle is associated with a threshold voltage, which is applied to the memory cells of a memory sector during the read cycle.

In case a decoding operation fails after a first read cycle (which is associated with a first threshold voltage), a second read cycle (which is associated with a second threshold voltage) is performed, during which the second threshold voltage is applied to the memory cells of the memory sector, where the first threshold voltage is different from the second threshold voltage. Thus, at least in part on a failure of decoding operation after a read cycle, one or more subsequent read cycles (associated with corresponding one or more threshold voltages) are performed, as will be disclosed in more detail herein later.

To increase an operational speed of the memory system 10, data is read from the memory 24 in a fast read mode (also referred to as regular read mode, or on-the-fly mode), and/or in a recovery mode (also referred to as re-read mode or additional-read mode). During a read cycle of the fast read mode, based on determining whether voltage levels of each memory cell of a memory sector is higher or lower compared to the applied threshold voltage, the read module 26 makes hard decisions on data bits stored in the memory cells of the memory sector (i.e., decides whether bit 0 or bit 1 is stored in individual memory cells). The read module 26 provides the hard decisions to the iterative decoder 32, which decodes data bits of the memory sector (e.g., corrects one or more errors in the estimation of the data bits). In some embodiments, hard decisions obtained during the fast read mode are provided directly to a hard decoder (not illustrated in FIG. 1). In other embodiments, hard decisions are mapped (for example, as LLRs with relatively high magnitude) in the LLR determination module 28 and the iterative decoder 32 is subsequently used to decode data bits associated with the hard decisions.

In a case where the decoding operation fails (e.g., due to relatively large number of errors in estimating data bits using hard decisions) during the fast read mode, the read module 26 reads data from the memory 24 in the recovery mode. That is, for memory sectors that fail in the fast read mode, the memory system 10 enters the recovery mode, where more exhaustive read and decoding attempts are made. In various embodiments, the fast read mode involves more than one read cycle (e.g., two, or three read cycles).

Reading a sector in a recovery mode takes longer time compared to that in the fast read mode. However, the recovery mode usually occurs with a relatively low probability (i.e., only when the fast read mode fails) and ensures that each memory sector of the memory 24 is correctly decoded with a relatively low probability of failure.

In the recovery mode, the LLR determination module 28 outputs LLRs corresponding to data bits of memory cells of a memory sector of the memory 24. During this mode of operation, the LLR determination module 28 provides a soft estimation for the data bits of the memory cells of the memory sector. That is, LLR determination module 28 provides in the form of LLRs, probability of each data bit being 0 or 1. LLR for a data bit may be defined as $$LLR = \log\left(\frac{\text{Probability of the data bit being equal to } 0}{\text{Probability of the data bit being equal to } 1}\right).$$

Thus, a positive LLR indicates a greater probability of the data bit being equal to 0, and a negative LLR indicates a greater probability of the data bit being equal to 1. That is, a sign of the LLR provides an estimation of the data bit, and a magnitude of the LLR provides a reliability of the estimation (e.g., |LLR|=0 means the estimation is completely unreliable, and |LLR|=∞ means that the estimation is completely reliable and the bit value is known).

The iterative encoder 20 and the iterative decoder 32 performs encoding and decoding operation using iterative code encoding and iterative soft decoding techniques, respectively. For example, iterative encoder 20 and the iterative decoder 32 employs low density parity check (LDPC) codes, Turbo codes, or any other appropriate iterative codes for encoding and/or decoding data.

Figure 2:
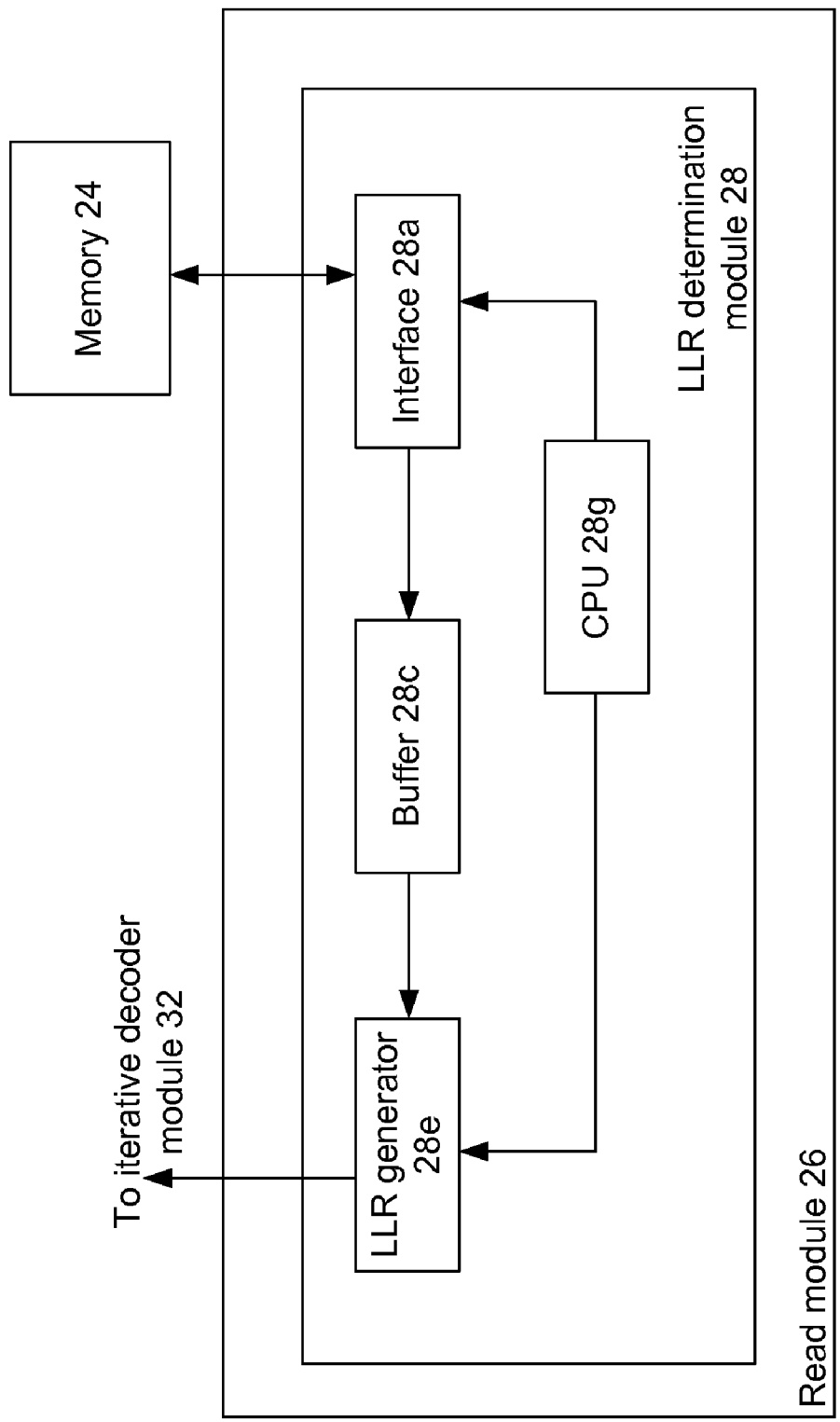
FIG. 2 schematically illustrates an LLR determination module of FIG. 1 in more detail.

FIG. 2 schematically illustrates the LLR determination module 28 in more detail. The LLR determination module 28 includes an interface 28a operatively coupled to the memory

24. A buffer 28*c* receives data bits from the memory 24 through the interface 28*a*, buffers the received data bits, and transmits the buffered data bits to an LLR generator 28*e*. The LLR generator 28*e* generates LLRs corresponding to the data bits, and transmits the generated LLRs to the iterative decoder 32. A central processing unit (CPU) 28*g* controls one or more operations of the LLR determination module 28, including operations of the interface 28*a* and the LLR generator 28*e*.

Figure 3:
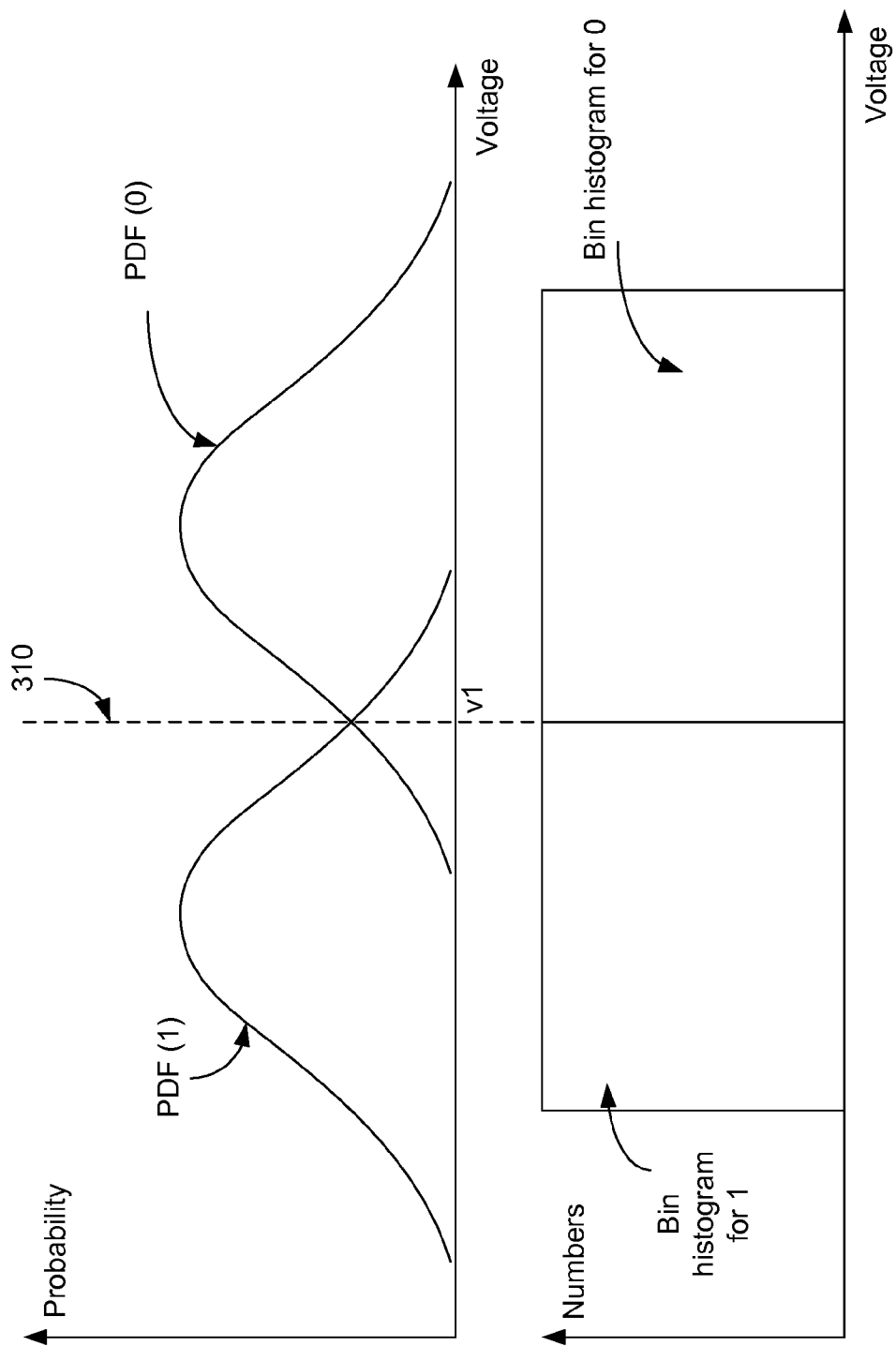
FIG. 3 schematically illustrates probability density functions (PDFs) associated with probabilities of a data bit being 0 or 1, as a function of a voltage, and also illustrates corresponding bin histograms.

FIG. 3 schematically illustrates probability density functions (PDFs) associated with probabilities of a data bit being 0 or 1, as a function of a voltage, and also illustrates corresponding bin histograms. There are two graphs in FIG. 3, with the top graph illustrating the PDFs and the bottom graph illustrating the bin histograms. The voltage in the top graph of FIG. 3 is a voltage level of individual memory cells. The PDF (1) is a PDF for a data bit in a memory cell being 1, and the PDF (0) is a PDF for the data bit being 0. For example, if the voltage level of a memory cell is relatively high, the associated data bit is 0 with high probability; and if the voltage level is relatively low, the data bit is 1 with high probability (although in other embodiments, the opposite may also be possible based on, for example, configuration of the memory system 10). The illustrated PDFs are bell shaped, but any other shapes are also possible. Also, the two PDFs are illustrated to be symmetrical, although in some embodiments the two PDFs may not be symmetrical.

In FIG. 3, a vertical dotted line 310 passes through a point of intersection of the PDF (1) and the PDF (0). The line 310 corresponds to a threshold voltage v1 applied to memory cells of a memory sector during a read cycle. For a given memory cell, the read module 24 determines whether a voltage level of the memory cell is higher or lower compared to the applied threshold voltage v1. For each memory cell, based on such determination, one of the two bin histograms is incremented by one. For example, the bin histogram on the right of the dotted line 310 is incremented by one if the voltage level of the memory cell is determined to be higher compared to the applied threshold voltage v1. Also, based on the assumption that memory cells storing bit 0 has a higher voltage level than memory cells storing bit 1 (as also illustrated in the two PDFs, although such an assumption is merely an example and is not limiting on the teachings of this disclosure), the bin histogram to the right of the dotted line 310 is assigned as bin histogram for bit 0 (hereinafter also referred to as bin histogram 0) and the bin histogram to the left of the dotted line 310 is assigned as bin histogram for bit 1 (hereinafter also referred to as bin histogram 1). Thus, based on applying the threshold voltage v1, the read module 26 estimates whether a memory cell stores bit 0 or bit 1, and increments one of the two bin histograms accordingly. The bin histogram 0, thus, reflects a count of memory cells in a memory sector that have higher voltages compared to the applied threshold voltage, and accordingly, reflects a count of memory cells in the memory sector that stores bit 0. Similarly, the bin histogram 1 reflects a count of memory cells in the memory sector that have lower voltages compared to the applied threshold voltage, and accordingly, reflects a count of memory cells in the memory sector that stores bit 1.

As the two PDFs of FIG. 3 are symmetrical and as the line 310 passes through the point of intersection of the two PDFs, about half the data bits will be estimated as 0 and about half the data bits will be estimated as 1 (assuming that the number of 0's and 1's stored in the memory sector are almost equal). Thus, as illustrated in FIG. 3, the two bin histograms have almost same height. The voltage v1 represents an optimal threshold voltage for applying to the memory sectors of the memory 24 during read cycles.

In practice, the PDF (1) and PDF (0) are usually not known for the memory system 10. Accordingly, the threshold voltage v1 (which represents the optimal threshold voltage for applying to the memory sectors of the memory 24 during a read cycle) is also not known during the read operations of the memory 24. Furthermore, the optimal threshold voltage can change with time for a flash memory (e.g., as the flash memory undergoes more and more number of write, retention and/or read cycles), can vary between two memory sectors of the memory 24, and can also vary between two memory cells of a single memory sector. Accordingly, it is usually not possible to know a priori the optimal threshold voltage v1, and accordingly, not possible to correctly apply the optimal threshold voltage v1 to the memory 24 during read cycles.

Figure 4:
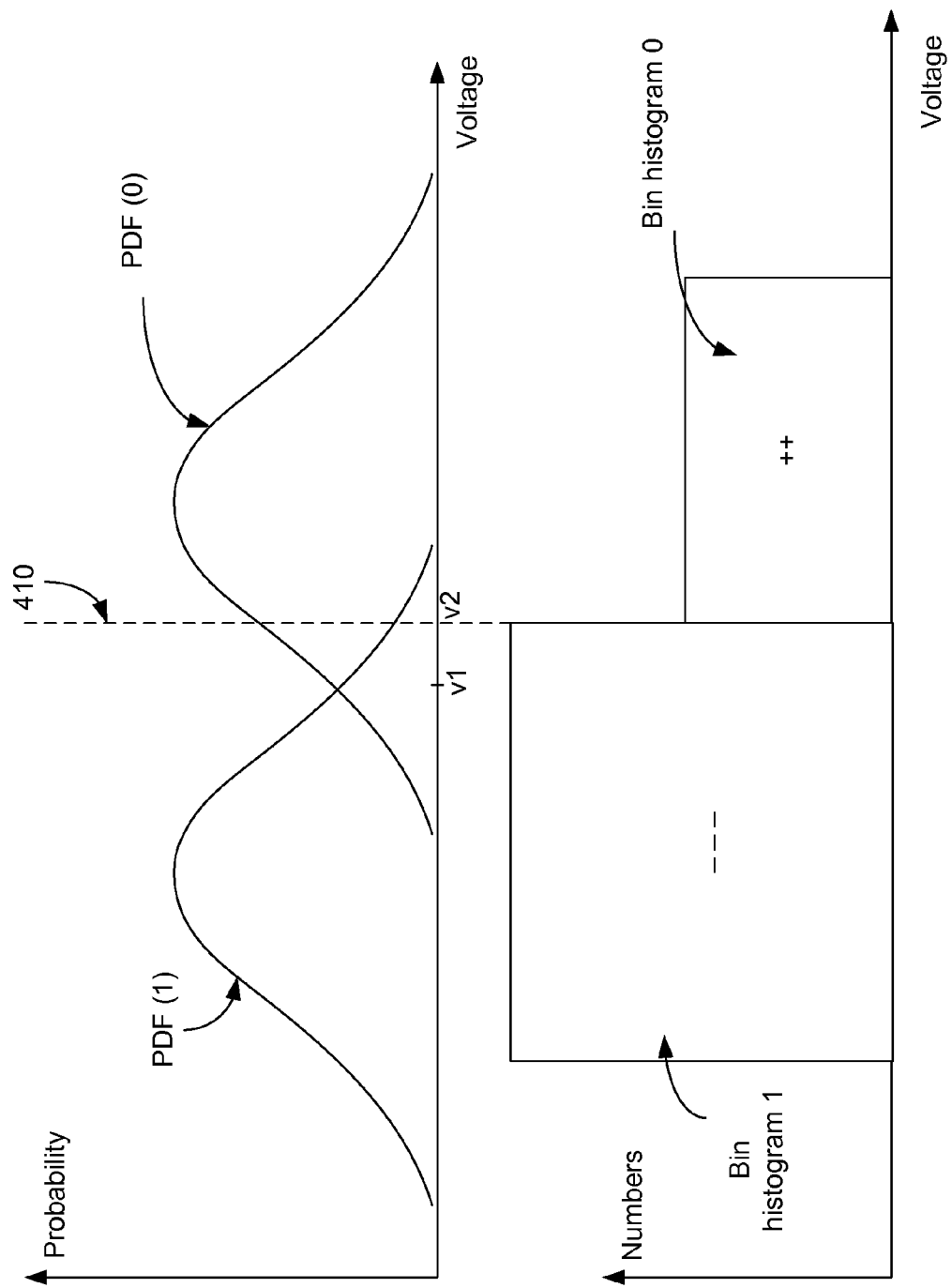
FIG. 4 illustrates an example of a read cycle in the fast read mode, where hard decisions are made on whether individual data bits are 1 or 0.

Accordingly, in practice, during a read cycle, a threshold voltage v2 is applied to a memory sector of the memory 24, where the threshold voltage v2 can be different from (e.g., greater than) the optimal threshold voltage v1, as illustrated in FIG. 4. FIG. 4 illustrates an example of a read cycle in the fast read mode, where hard decisions are made on whether individual data bits are 1 or 0. As the threshold voltage v2 in FIG. 4 is greater than the optimal threshold voltage v1 of FIG. 3, a probability of determining a data bit as 1 increases (e.g., compared to a probability of determining a data bit as 0), resulting in a taller height of the bin histogram 1 compared to the bin histogram 0, as illustrated in the bottom graph in FIG. 4. That is, as the threshold voltage v2 is greater than the optimal threshold voltage v1, some data bits that are actually 0 are now erroneously estimated as bit 1, thereby increasing the height of the bin histogram 1.

For the purpose of this disclosure and unless disclosed otherwise, a bin histogram for 0 is labeled as one of 0+, +, ++, +++, ++++, etc. (i.e., zero with a plus, a single plus sign, two plus signs, or three plus signs, etc.); a bin histogram for 1 is labeled as one of 0−, −, −−, −−−, etc. (i.e., zero with a minus, a single minus sign, two minus signs, three minus signs, etc.); and a bin histogram is labeled as 0 if an estimation of whether the bin histogram is associated with bit 1 or bit 0 cannot be reliably performed. Thus, a sign (i.e., + or −), if associated with a bin histogram label, indicates whether the bin histogram is for 0 or 1. For example, a plus sign being associated with a bin histogram label indicates that the bin histogram is for 0, and a minus sign being associated with a bin histogram label indicates that the bin histogram is for 1. This sign notation is consistent with the sign notation of LLRs, where a positive LLR indicates a greater probability of the data bit being equal to 0, and a negative LLR indicates a greater probability of the data bit being equal to 1, as previously disclosed. Also, a number of signs indicate a relative magnitude or a relative height of the associated bin histogram. For example, a bin histogram with a single sign (e.g., bin histogram with label +) has a higher height compared to a bin histogram with a zero and a sign (e.g., bin histogram with label 0+); a bin histogram with two signs (e.g., bin histogram with label ++) has a higher height compared to a bin histogram with a single sign (bin histogram with label +), and so on. Thus, three minus signs for the bin histogram 1 and two plus signs for the bin histogram 0 in FIG. 4 indicate that the bin histogram 1 is taller compared to the bin histogram 0. That is, the bin histogram 1 has more entries compared to the bin histogram 0 (i.e., more 1's has been estimated compared to 0's).

Figure 5:
FIG. 5 illustrates a table that maps labels of bin histograms to corresponding LLR magnitudes.

FIG. 5 illustrates a Table 500 that maps labels of bin histograms to corresponding LLR magnitudes. For example, as illustrated in Table 500, a bin histogram with a label of 0− has an LLR that ranges from −2 to 0, a bin histogram with label − has an LLR that ranges from −5 to −3, and so on. Although only LLR ranges are illustrated in FIG. 5, a random number within the range (e.g., an LLR of −0.75 for bin histogram 0−), an average of the range (e.g., an LLR of −1 for bin histogram 0−), and/or the simply the range (e.g., an LLR range of 0 to −2 for bin histogram 0−) of a bin histogram may be output by the read module 26 (e.g., by the LLR determination module 28) to the iterative decoder 32.

The mapping of FIG. 5 is merely an example, and in various other embodiments, a different mapping may also be used based at least in part on, for example, configurations of the memory 24, the read module 26 and/or the iterative decoder 32.

As previously disclosed, in the case a decoding operation after the fast read mode fails (e.g., due to a relatively large number of errors during a read cycle in the fast read more, which is beyond the correction ability of the iterative decoder 32), the memory system 10 enters the recovery mode, where one or more subsequent read cycles are performed with different threshold voltage(s).

Figure 6:
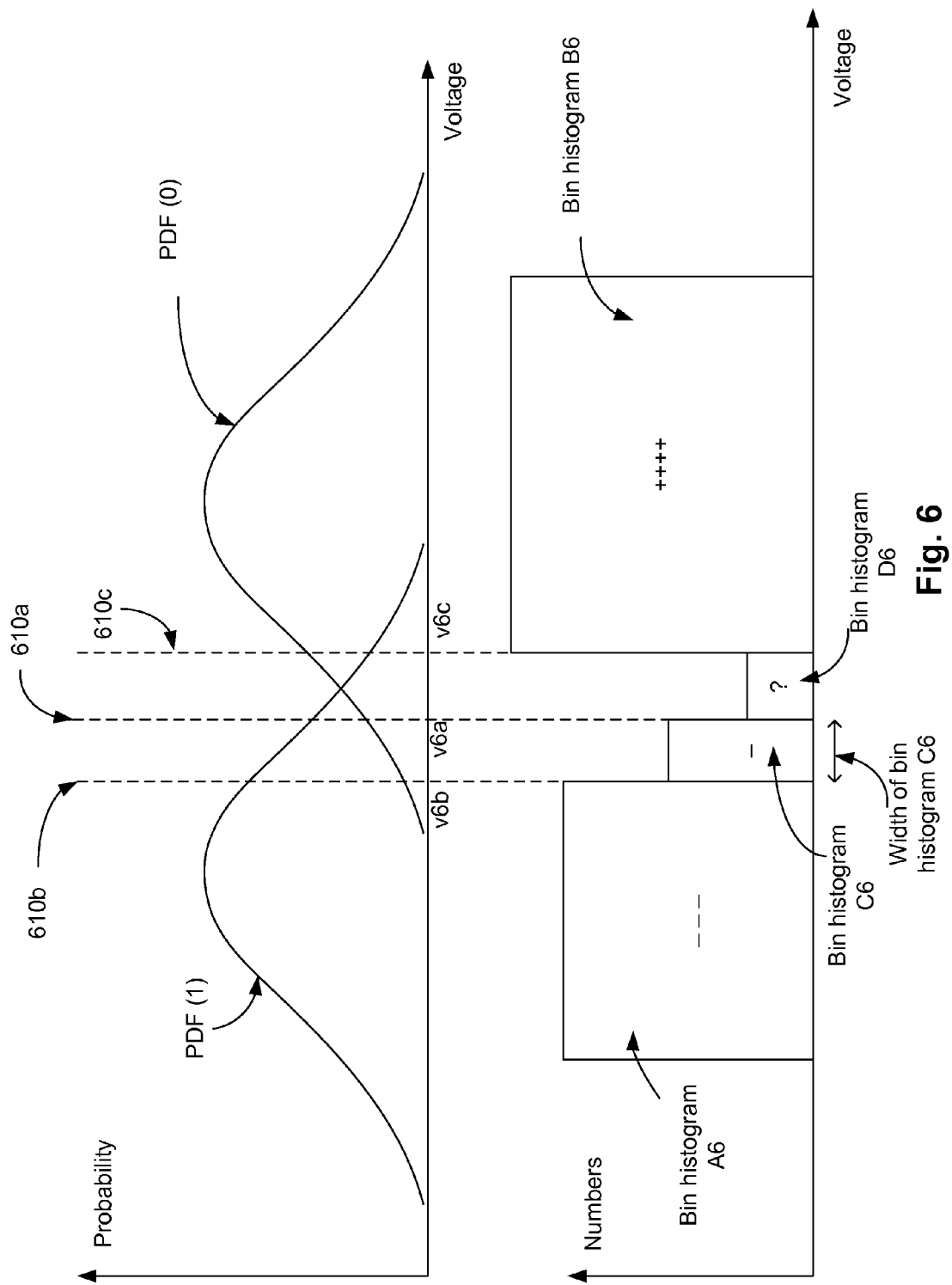
FIG. 6 illustrates bin histograms corresponding to three read cycles.

FIG. 6 illustrates bin histograms corresponding to three read cycles. For example, a first read cycle, which is performed as a part of the fast read mode, is associated with a threshold voltage v6a. That is, for the first read cycle, threshold voltage v6a (illustrated by the dotted line 610a) is applied to memory cells of a memory sector, and corresponding bin histograms (although not illustrated in FIG. 6, but is at least in part similar to the bin histograms of FIG. 4) are generated. In a case where the first read operation in the fast read mode fails, the read module 26 enters the recovery mode of operation, where a second read cycle is performed with a threshold voltage v6b (illustrated by the dotted line 610b). That is, during the second read cycle, the read module 24 determines whether voltage levels of the memory cells are higher or lower compared to the threshold voltage v6b. Based on this determination, the read module 26 constructs three bin histograms (not illustrated in FIG. 6), maps the three bin histograms into corresponding LLRs (e.g., using the mapping of Table 500), and transmits the mapped LLRs to the iterative decoder 32. In a case where iterative decoder 32 fails to decode the data bits (i.e., if the second read cycle fails), the read module 26 performs a third read cycle with a threshold voltage v6c (illustrated by the dotted line 610c). That is, during the third read cycle, the read module 24 determines whether voltage levels of the memory cells are higher or lower compared to the threshold voltage v6c. Based on this determination, the read module 26 constructs four bin histograms (illustrated as bin histograms A6, B6, C6 and D6 in FIG. 6).

For example, the bin histogram A6 is associated with a number of memory cells for which the voltage levels are estimated to be less than the threshold voltage v6b, the bin histogram C6 is associated with a number of memory cells for which the voltage levels are estimated to be between threshold voltages v6a and v6b, the bin histogram D6 is associated with a number of memory cells for which the voltage levels are estimated to be between threshold voltages v6a and v6c, and the bin histogram B6 is associated with a number of memory cells for which the voltage levels are estimated to be greater than the threshold voltage v6c.

As illustrated in FIG. 6, the bin histogram D6 is the shortest bin histogram (i.e., having shortest height among all the four bin histograms), and bin histograms C6 and B6 are immediate neighboring bin histograms to the shortest bin histogram D6. Also, the bin histogram B6 is the tallest bin histogram among all the four bin histograms, followed by bin histograms A6, C6 and D6. The signs (e.g., whether − or +) of bin histograms A6, C6 and D6 are based on, for example, whether these bin histograms lie on left or right of the shortest bin histogram B6. For example, the shortest bin histogram D6 determines an approximate middle point, and bin histograms to the left of the shortest bin histogram D6 are assigned negative LLRs (i.e., bin histograms to the left of the shortest bin histogram D6 are estimated to have a greater probability of being associated with bit 1), and bin histograms to the right of the shortest bin histogram D6 are assigned positive LLRs (i.e., bin histograms to the right of the shortest bin histogram D6 are estimated to have a greater probability of being associated with bit 0). Also, the magnitude of the LLRs of the bin histograms A6, C6 and D6 are based on the height of the respective bin histograms. For example, in FIG. 6, bin histograms B6, A6, and C6 are labeled as ++++, ---, and -, respectively.

A bin histogram is an outer histogram if there are no bin histograms on either the left or the right side of the bin histogram. In FIG. 6, bin histograms A6 and B6 are outer bin histograms. A bin histogram is an inner histogram if there are at least one neighboring bin histogram on the left side and at least one neighboring bin histogram on the right side of the bin histogram. In FIG. 6, bin histograms C6 and D6 are inner bin histograms. A width of a bin histogram refers to a threshold voltage range associated with the bin histogram. For example, a width of the bin histogram C6 is equal to the difference between threshold voltages v6a and v6b Inner bin histograms have fixed widths, whereas widths of outer histograms are undefined. As previously discussed, a height of a bin histogram is associated with a number of data bits included in the bin histogram as a result of one or more read cycles. A normalized height of an inner bin histogram refers to the height of the inner histogram that is normalized by the width of the inner histogram. The normalized height of an outer bin histogram is undefined, as the width of the outer histogram is undefined. Hereinafter, for the purpose of this disclosure and unless otherwise disclosed, height of a bin histogram refers to a normalized height (if the bin histogram is an inner bin histogram) or an actual height (if the bin histogram is an outer bin histogram). However, the teachings of this disclosure are not limited by such aspects, and the teachings of this disclosure also pertain to an actual height of a bin histogram, even if the bin histogram is an inner bin histogram.

FIGS. 7 and 8 illustrate Rules 1 and 2, respectively, for assigning an LLR to a shortest bin histogram (e.g., shortest bin histogram D6 of FIG. 6). Referring to Rule 1 of FIG. 7, during a read cycle, if the shortest bin histogram D6 is less than a threshold number, the LLR determination module 28 assigns to the shortest bin histogram D6 a zero LLR (which corresponds to a label of 0, as illustrated in Table 500). On the other hand, if the shortest bin histogram D6 is greater than the threshold number, the LLR determination module 28 assigns a non-zero LLR (e.g., with label 0−, label 0+, or the like) to the shortest bin histogram D6 based at least in part on the Rule 2 of FIG. 8. Once the shortest bin histogram D6 is assigned an LLR or an associated label, the LLR determination module 28 maps the labels of the bin histograms (i.e., bin histograms A6, . . . , D6) into corresponding LLRs (e.g., using the mapping of Table 500), and transmits the mapped LLRs to the iterative decoder 32.

In various embodiments, the threshold number of Rule 1 is associated with a code rate or a syndrome size of the iterative decoder 32. If the code rate of the iterative decoder 32 is R, the threshold number of Rule 1 is set to, for example, $((1−R)/2)$ multiplied by a total area under all the four bin histograms A6, . . . , D6 (i.e., multiplied by a total number of data bits or counts associated with all the four bin histograms A6, . . . , D6). Put differently, an zero LLR (which corresponds to an indecision on whether the data bits included in the shortest bin histogram are 0 or 1) is assigned to the shortest bin histogram D6 under criterion (i) of Rule 1 only if there are relatively small number of data bits in the shortest bin histogram D6 (e.g., smaller than half syndrome size, or some other fraction of, the syndrome size, of the iterative decoder 32). That is, label 0 is assigned to the shortest bin histogram D6 if the iterative decoder 32 is powerful enough to correctly decode the data bits in spite of the indecision about the data bits included in the shortest bin histogram D6, assuming that most of the data bits included in other bin histograms are correctly estimated.

As illustrated in Rule 2 in FIG. 8, in a case where the shortest bin histogram D6 is greater than the above discussed threshold number (i.e., in the case where the shortest bin histogram D6 has relatively large number of data bits, which is beyond an erasure correction power of the iterative decoder 32), a non-zero LLR (e.g., with label 0−, label 0+, etc.) is assigned to the shortest bin histogram D6 based on either criterion (i) or criterion (ii) of Rule 2.

According to the criterion (i) of Rule 2, the shortest bin histogram D6 is assigned a non-zero LLR, where a magnitude of the non-zero LLR is assigned based on the height of the shortest bin histogram D6 (for example, if the shortest bin histogram D6 is of relatively small height, assign either 0− or 0+, and so on), and where a sign of the non-zero LLR (e.g., sign of the associated label) of the shortest bin histogram D6 is assigned based on a sign of the immediate neighboring bin histogram that is taller among the two immediate neighboring bin histograms B6 and C6. As the immediate neighboring bin histogram B6 is relatively taller than the immediate neighboring bin histogram C6, according to criterion (i) of Rule 2, the shortest bin histogram D6 is assigned a label 0+, +, ++, or the like, based on the height of the shortest bin histogram D6 (i.e., the shortest bin histogram D6 is assigned a positive LLR, which is same as the sign of the LLR of the immediate neighboring bin histogram B6).

Referring again to FIG. 8, according to the criterion (ii) of Rule 2, the shortest bin histogram D6 is assigned a non-zero LLR, where a magnitude of the non-zero LLR of the shortest bin histogram D6 is assigned based on the height of the shortest bin histogram D6, and where a sign of the non-zero LLR is assigned based on a comparison of (A) a number of bin histograms to the left of the shortest bin histogram D6, and (B) a number of bin histograms to the right of the shortest bin histogram D6. For example, in FIG. 6, the shortest bin histogram D6 has two bin histograms (i.e., bin histograms A6 and C6) in the left and only one bin histogram (i.e., bin histogram B6) in the right. Thus, according to criterion (ii) of Rule 2, the shortest bin histogram D6 is assigned a label 0−.

In various embodiments, any one of the criterion (i) or criterion (ii) of Rule 2 may be used for assigning an LLR to the shortest bin histogram D6, based on, for example, a preference of a user of the memory system 10, configuration of various components (e.g., the iterative decoder 32) of the memory system 10, and/or the like.

As Rules 1 and 2 are associated with assigning an appropriate LLR to the shortest bin histogram D6, Rules 1 and 2 are also referred to herein as assignment rules for the shortest bin histogram.

Once the shortest bin histogram D6 is assigned an LLR (or an associated label) according to Rules 1 and/or 2, the LLR determination module 28 maps the bin histograms A6, . . . , D6 to respective LLRs (e.g., using the mapping of Table 500), and outputs the LLRs of the data bits of the memory cells of the memory sector to the iterative decoder 32. The iterative decoder 32 attempts to decode data bits of the memory cells based on the received LLRs.

In a case where the iterative decoder 32 successfully decodes the data bits of the memory cells of the memory sector, then reading of the memory sector is complete, and the read module 26 proceeds to read another memory sector (if desired) of the memory 24. However, in a case where the iterative decoder 32 fails to successfully decode the data bits of the memory cells during the current read cycle, the read module 26 performs another read cycle with a new threshold voltage, or new threshold voltages (e.g., as a part of the recovery mode). FIGS. 9, 10, and 11 illustrate Rules 3, 4 and 5, respectively, for determining a new threshold voltage for another read cycle in the recovery mode.

Referring to FIG. 9, according to Rule 3 (also referred to herein as the splitting rule for splitting the shortest bin histogram), if (A) decoding fails during a read cycle in the recovery mode, and/or (B) if the shortest bin histogram D6 is greater than the threshold number (e.g., the threshold number of Rules 1 and 2), then the read module 26 performs another read cycle with a new threshold voltage, where the new threshold voltage splits the shortest bin histograms into two new bin histograms. FIG. 12 schematically illustrates bin histograms corresponding to three read cycles of FIG. 6, along with another read cycle with a new threshold voltage v12a. In FIG. 12, the new threshold voltage v12a is illustrated by dotted line 1210a. The shortest bin histogram D6 of FIG. 6 was associated with threshold voltages v6a and v6c. Accordingly, the new threshold voltage v12a of FIG. 12 is chosen such that the new threshold voltage v12a is between threshold voltages v6a and v6c, and the new threshold voltage v12a splits the shortest bin histogram D6 of FIG. 6 to form two new bin histograms D12a and D12b based on results of the another read cycle.

As illustrated in FIG. 12, bin histogram D12a is taller than the bin histogram D12b, and the bin histogram D12b is now the shortest bin histogram. Also, as the bin histogram D12a lies to the right of the bin histogram D12b, and accordingly, as previously discussed, the bin histogram D12a is assigned a positive LLR with label 0+ (or +, ++, or the like, based on the height of the bin histogram D12a). Also, as the bin histogram D12b is now the shortest bin histogram, the bin histogram D12b is assigned a label or an LLR according to Rules 1 and/or 2 of FIGS. 7 and 8, respectively.

Referring again to FIGS. 6 and 10, according to Rule 4 (also referred to as splitting rule for splitting an immediate neighboring bin histogram), if (A) decoding fails during a read cycle in the recovery mode, and/or (B) if the shortest bin histogram D6 is shorter than the threshold number (i.e., the threshold number discussed with respect to Rules 1 and 2), then the read module 26 performs another read cycle with a new threshold voltage, where the new threshold voltage splits one of the two immediate neighboring bin histograms C6 and B6 of the shortest bin histogram D6 based on a suitable criterion (e.g., a criterion based on Rule 5, illustrated in FIG. 11, or any other suitable criterion). For example, as per criterion (i) of Rule 5 (also referred to as splitting rule for splitting an immediate neighboring bin histogram), the read module 26 performs another read cycle with a new threshold voltage, where the new threshold voltage splits one of the two immediate neighboring bin histograms C6 and B6 of the shortest bin histogram D6 based on, for example, a comparison of heights of the two immediate neighboring bin histograms B6 and C6 of the shortest bin histogram D6. For example, the bin histogram B6 is relatively taller than the bin histogram C6, and accordingly, bin histogram C6 is split in the another read cycle, as illustrated in FIG. 13.

Figure 13:
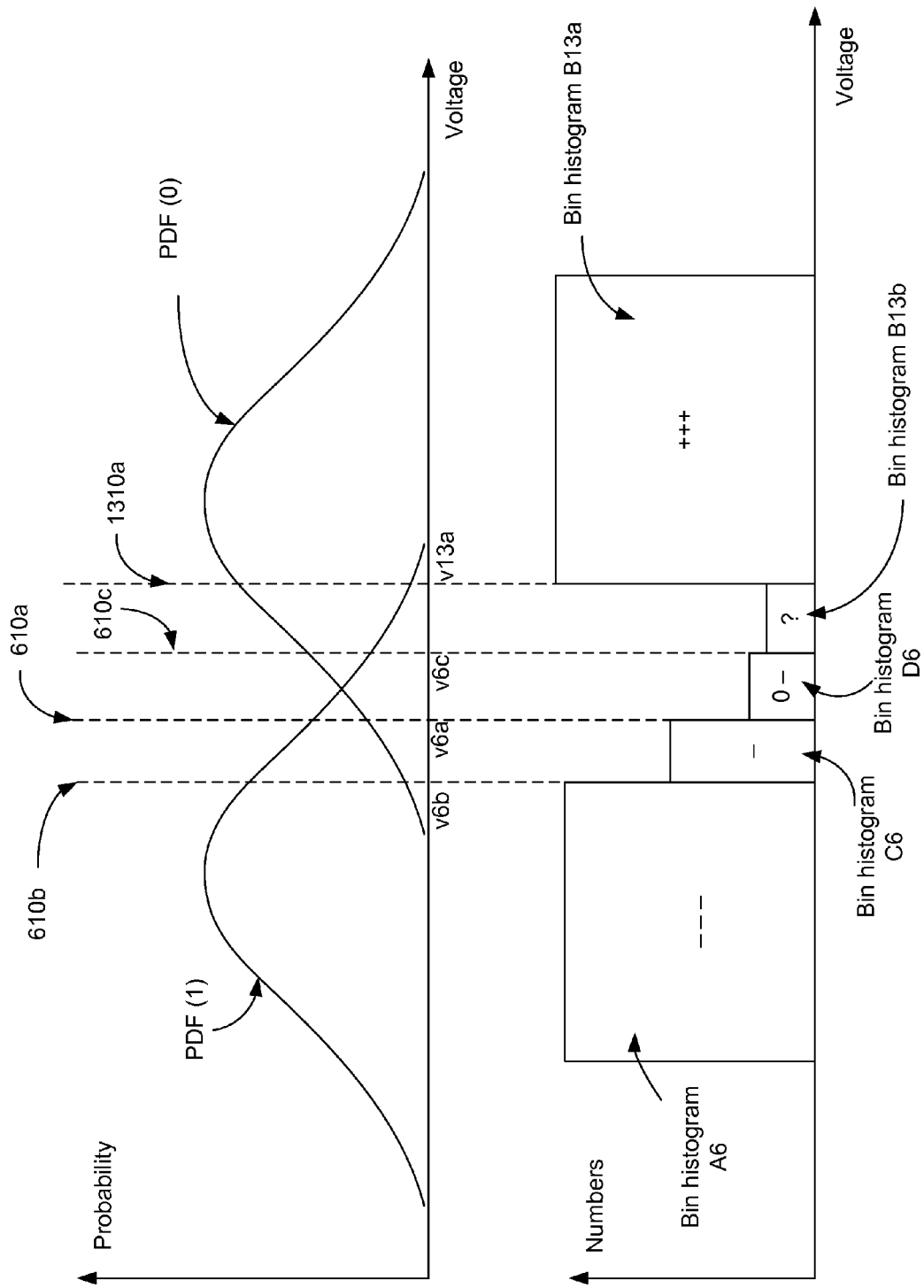
FIG. 13 schematically illustrates splitting the shortest bin histogram during a read cycle.

FIG. 13 schematically illustrates bin histograms corresponding to three read cycles of FIG. 6, along with another read cycle with a new threshold voltage v13a. In FIG. 13, the new threshold voltage v13a is illustrated by dotted line 1310a. According to Rule 4 and Rule 5(i), the immediate neighboring bin histogram B6 of the shortest bin histogram D6 of FIG. 6 is split in FIG. 13 by the new threshold voltage v13a. The bin histogram B6 of FIG. 6 was associated with the threshold voltage v6c. Accordingly, the new threshold voltage v13a of FIG. 13 is chosen such that the new threshold voltage v13a is slightly greater than threshold voltage v6c, and the new threshold voltage v13a splits the bin histogram B6 of FIG. 6 to form two new bin histograms B13a and B13b based on the results of the another read cycle.

As illustrated in FIG. 13, bin histogram B13b is the new shortest bin histogram in FIG. 13. Accordingly, bin histogram D6, which is in the left of the new shortest bin histogram B13b, is assigned a negative LLR (e.g., with a label of 0−). Also, the new shortest bin histogram B13b is assigned a label according to Rules 1 and/or 2 of FIGS. 7 and 8, respectively.

Rule 5(ii) states that if there is only one bin histogram to the left or to the right of the shortest bin histogram, perform another read cycle with a new threshold voltage and split the only one bin histogram. For example, in FIG. 6, bin histogram B6 is the only bin histogram to the right of the shortest bin histogram D6. According, as also illustrated in FIG. 13, in accordance with Rules 4 and 5(ii), the bin histogram B6 is split to form two new bin histograms B13a and B13b through another read cycle with the new threshold voltage v13a.

Figure 15:
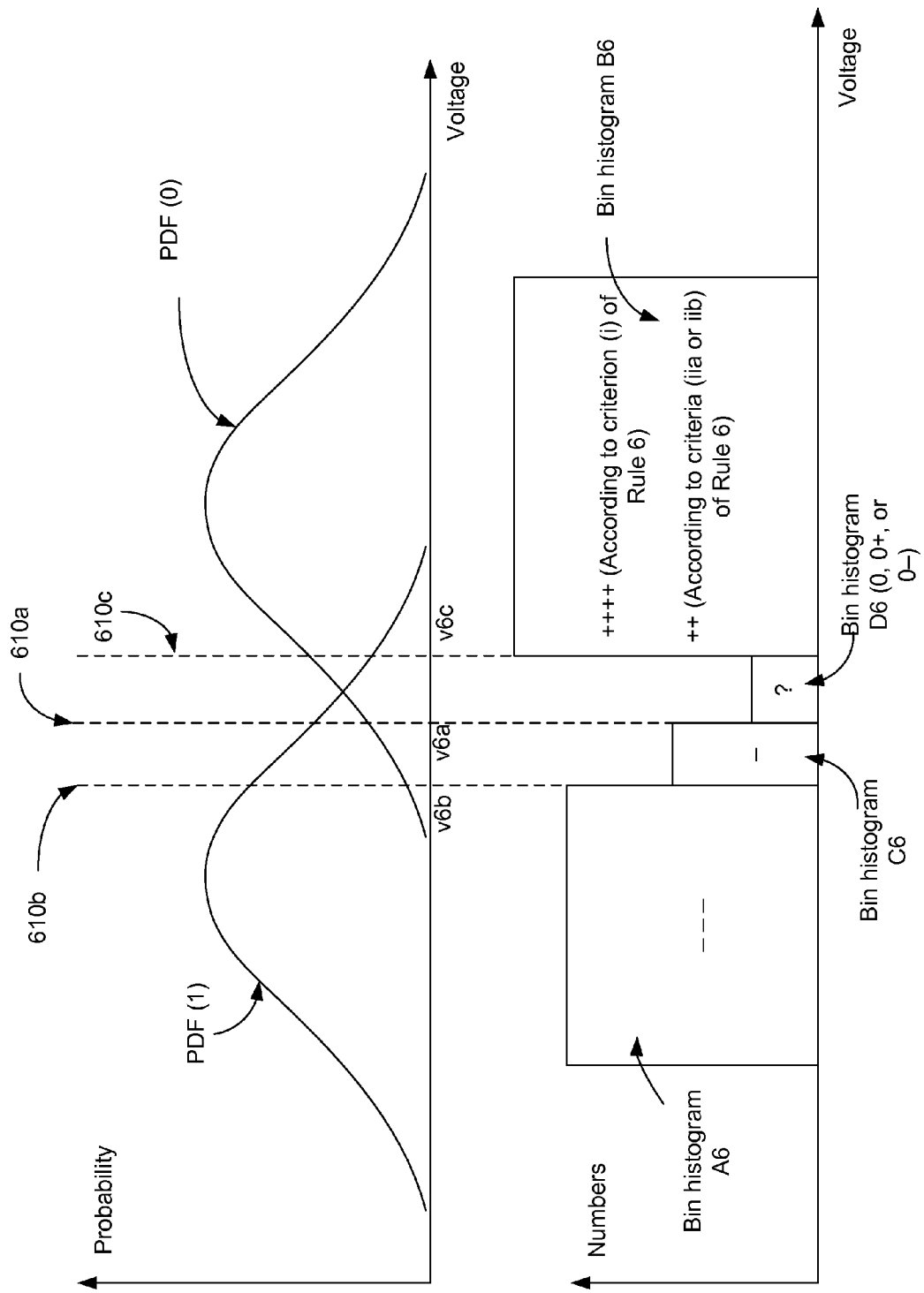
FIG. 15 schematically illustrates splitting an immediate neighboring bin histogram of the shortest bin histogram during a read cycle.

FIG. 14 illustrates Rule 6 (also referred to as assignment rule for bin histograms that are immediate neighbors of the shortest bin histograms), which is associated with assigning labels to bin histograms that are immediate neighbors of the shortest bin histogram. Rule 6 of FIG. 14 states that (i) assign, to bin histograms (e.g., bin histograms C6 and B6 of FIG. 6) that are immediate neighbors of the shortest bin histogram D6, LLRs (or associated labels) based on the heights of the immediate neighboring bin histograms C6 and B6; or (iia) if an immediate neighboring bin histogram (e.g., bin histogram B6) of the shortest bin histogram D6 is relatively very tall compared to the shortest bin histogram D6 (e.g., if a ratio of heights of the immediate neighboring bin histogram B6 and the shortest bin histogram D6 exceeds a user definable threshold ratio), assign a relatively small LLR to the immediate neighboring bin histogram B6 (e.g., small in magnitude compared to a magnitude of the LLR associated with the height of the bin histogram B6), and/or (iib) if there is only one bin histogram to the left or right of the shortest bin histogram D6 (e.g., only bin histogram B6 to the right of the shortest bin histogram D6), assign a relatively small LLR to the only one bin histogram B6 (e.g., small compared to the LLR associated with the height of the bin histogram B6). In various embodiments, either criterion (i) or (criteria (iia) and/or (iib)) of Rule 6 is followed. Thus, as illustrated in FIG. 15 (which is similar to FIG. 6, expect for the label assignment to bin histogram B6), according to criterion (i) of Rule 6, the bin histogram B6 is assigned a label of ++++ (similar to the label assignment in FIG. 6). However, according to criterion (iia) of Rule 6, the bin histogram B6 is assigned a label that has less number of signs compared to ++++. For example, according to criterion (iia) of Rule 6, the bin histogram B6 is assigned a label of ++, which corresponds to a lower LLR compared to an LLR (e.g., with a label ++++) that would have been assigned to the bin histogram B6 if only the height of the bin histogram B6 were to be considered. As the relatively tall bin histogram B6 is an immediate neighbor of the shortest bin histogram D6, the bin histogram B6 may have a few relatively poor estimates of data bits. Hence, according to criterion (iia) of Rule 6, the bin histogram B6 is assigned a relatively smaller LLR.

Similarly, according to criterion (iib) of Rule 6, the bin histogram B6 is assigned a label (or an associated LLR) that has less number of signs compared to ++++. For example, according to criterion (iib) of Rule 6, the bin histogram B6 is assigned a label of ++, which corresponds to a lower LLR compared to an LLR associated with the label of ++++.

Rules 1, . . . , 6 disclosed here are examples of rules, and many other rules can also be derived from these rules by someone skilled in the art, based on the teachings of this disclosure. For example, although not illustrated in any of the figures, a rule can state that if (A) decoding fails during a read cycle in the recovery mode, and/or (B) if the shortest bin histogram is shorter than the threshold number, then perform another read cycle with a new threshold voltage, where the new threshold voltage splits the tallest bin histogram.

In the bin histograms illustrated in FIGS. 3, 4, 6 and 12-14, individual memory cells of the memory 24 are assumed to store a single bit of data. However, in various embodiments, one or more memory cells of a memory sector of memory 24 can store more than one bit of data, and the Rules 1-6 can be generalized to pertain to such situations as well.

Figure 16:
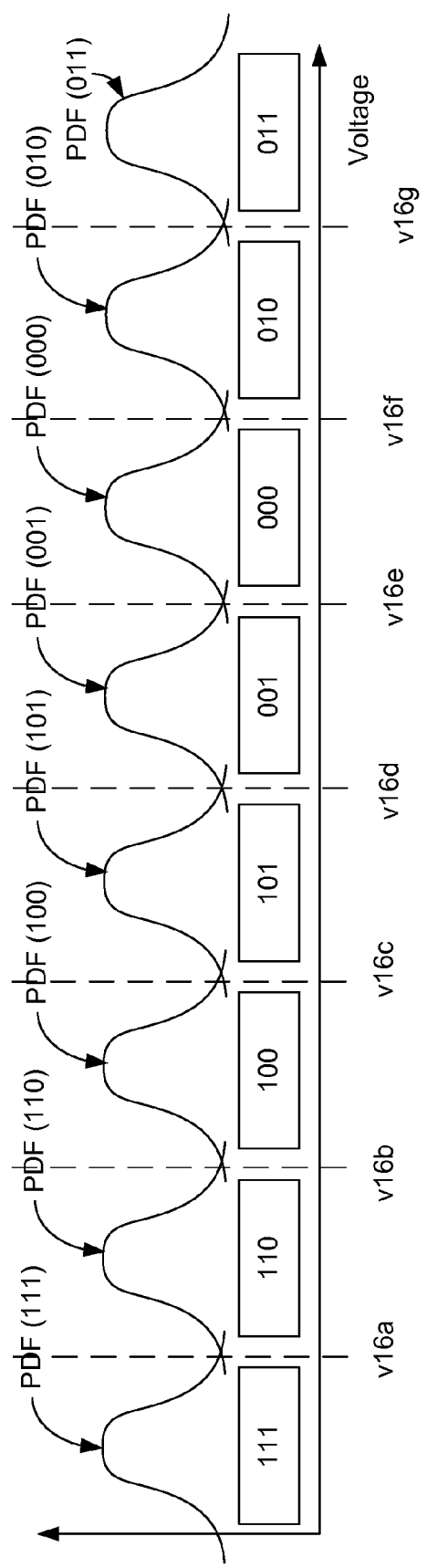
FIG. 16 schematically illustrates PDFs associated with probabilities of data bits, stored in the memory cells of a memory sector of FIG. 1, being one of 000, 001, . . . , 111, as a function of voltage levels of the memory cells.

In various embodiments, the memory cells of a memory sector of the memory 24 stores 3 bits of data. FIG. 16 schematically illustrates PDFs associated with probabilities of data bits, stored in the memory cells of a memory sector, being one of 000, 001, . . . , 111, as a function of voltage levels of the memory cells. FIG. 16 also illustrates optimal threshold voltages v16a, . . . , v16g for detecting the data bits stored in the memory cells. For example, if a voltage level of a memory cell is less than voltage v16a, the memory cell stores 111 with high probability; if the voltage level of the memory cell is between voltages v16c and v16d, the memory cell stores 101 with high probability; and so on.

The PDFs of FIG. 16 are merely examples of PDFs, and in no way limits the teachings of this disclosure. Also, the illustrated PDFs are bell shaped, but any other shapes are also possible. Also, the PDFs are illustrated to be symmetrical, although in some embodiments the PDFs may not be symmetrical.

Figure 17:
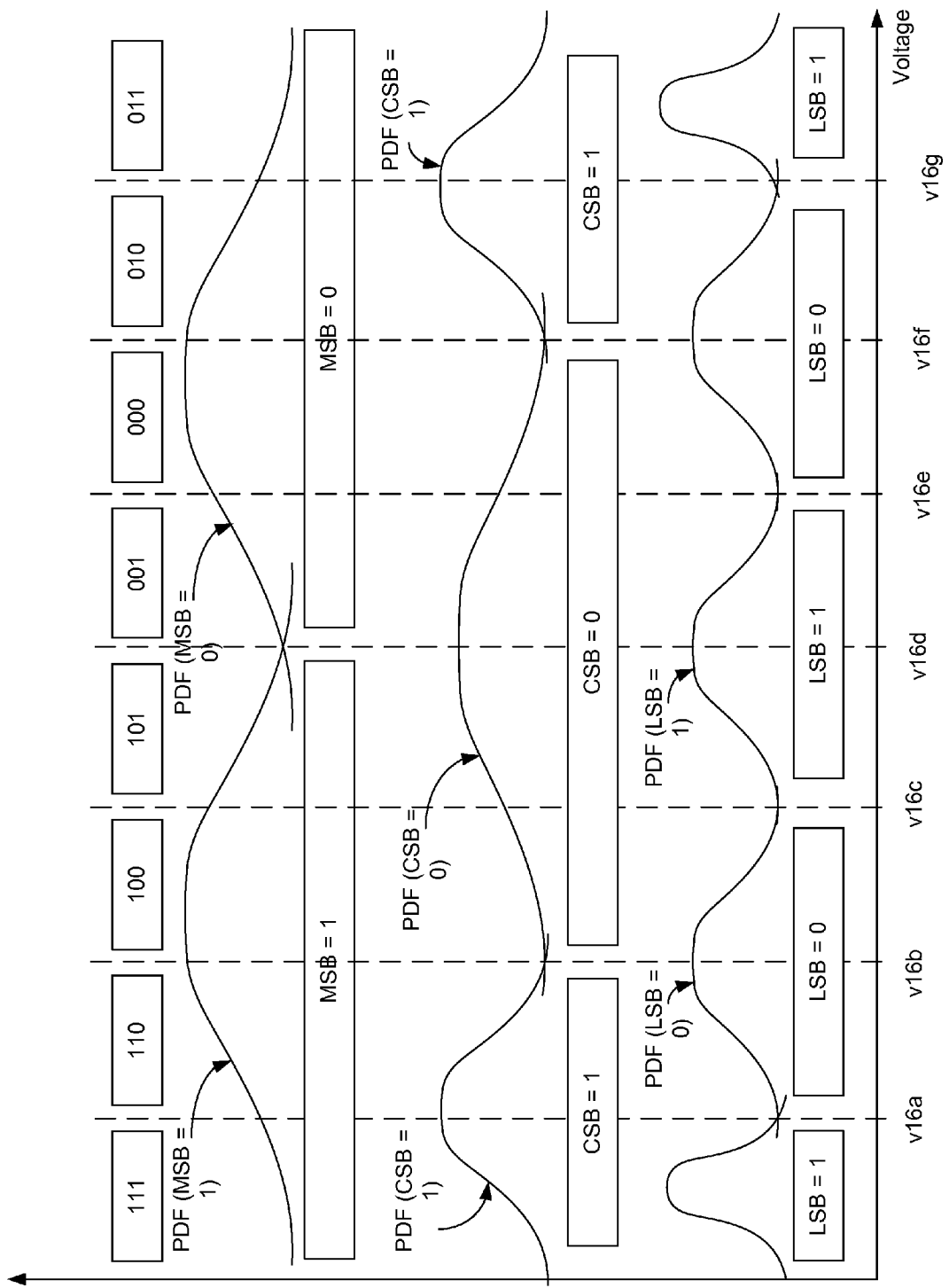
FIG. 17 schematically illustrates PDFs associated with probabilities of data bits stored in the memory cells of a memory sector, as a function of voltage levels of the memory cells.

FIG. 17 schematically illustrates PDFs associated with probabilities of data bits stored in the memory cells of a memory sector, as a function of voltage levels of the memory cells. Unlike FIG. 16, in FIG. 17 the PDFs are associated with most significant bits (MSB), center significant bits (CSB), and least significant bits (LSB) of 3 bit data stored in memory cells of a memory sector of the memory 24. For example, if a voltage level of a memory cell is less than voltage v16d, a MSB of the memory cell is 1 with high probability; if the voltage level of the memory cell is greater than voltage v16d, the MSB of the memory cell is 0 with high probability; if the voltage level of the memory cell is between voltages v16b and v16f, a CSB of the memory cell is 0 with high probability; if the voltage level of the memory cell is greater than voltage v16f or less then v16b, the CSB of the memory cell is 1 with high probability; and so on.

As previously discussed, the optimal threshold voltages v16a, . . . , v16g are not known a priori. Accordingly, in practice, during a read cycle, threshold voltages, which can be different optimal threshold voltages, are applied to the memory cells to estimate data bits stored in the memory cells. For example, during a single read cycle for reading memory cells that store 3 bits of data, seven different threshold voltages are applied to the memory cells.

Figure 18:
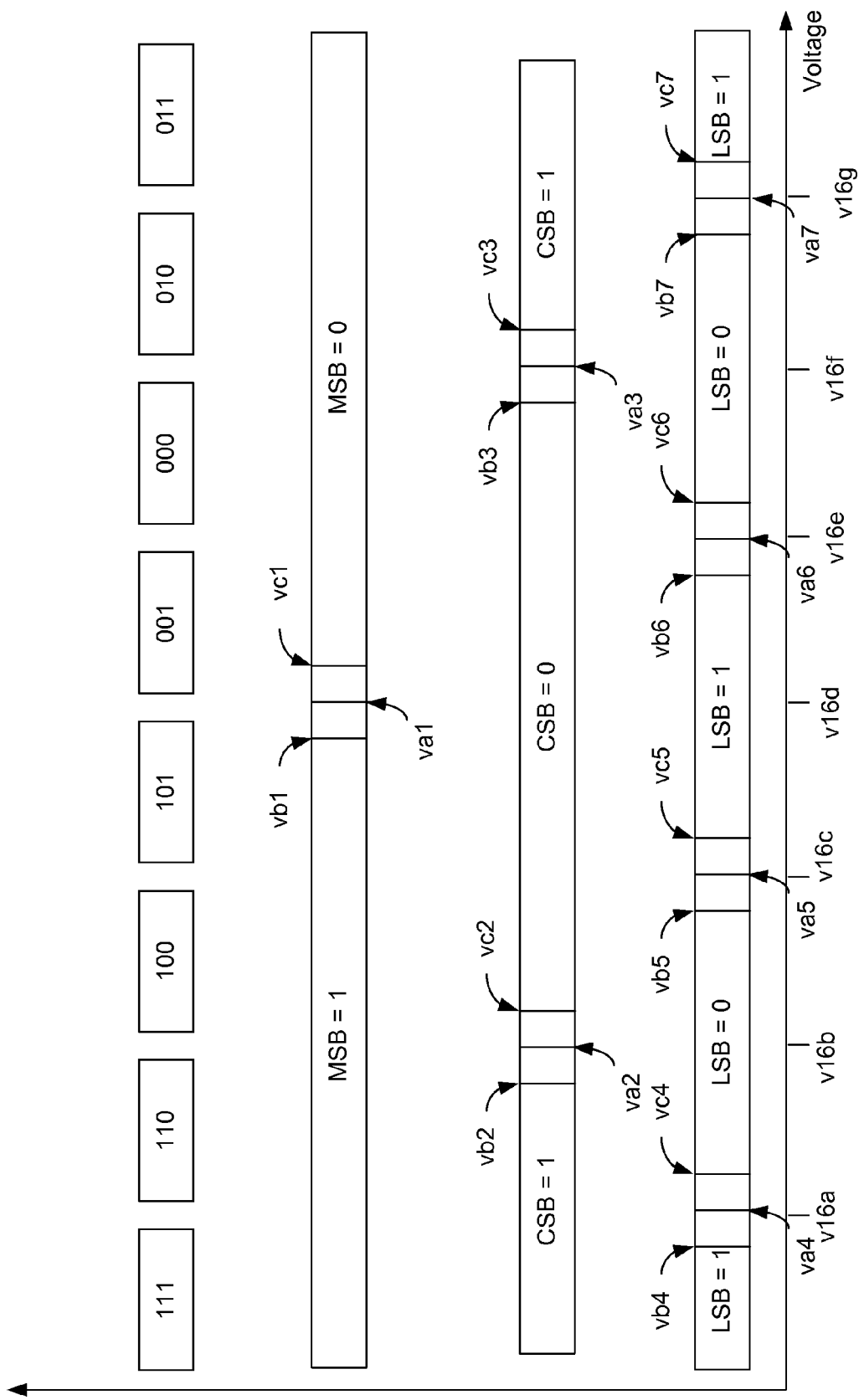
FIG. 18 discloses application of threshold voltages, associated with three read cycles, to memory cells of a memory sector of the memory of FIG. 1.

FIG. 18 discloses application of threshold voltages, associated with three read cycles, to memory cells of a memory sector of the memory 24. In the first read cycle (which is a part of the fast read mode), threshold voltages va1, ..., va7 are applied to individual memory cells. As illustrated in FIG. 18, results of application of threshold voltage va1 are used to construct bin histograms (although the constructed bin histograms are not illustrated in FIG. 18) for the MSBs, results of application of threshold voltages va2 and va3 are used to construct bin histograms for the CSBs, and results of application of threshold voltages va4, ..., va7 are used to construct bin histograms for the LSBs.

In case the decoding operation after the first read cycle fails, the memory system 10 enters the recovery mode. In the second read cycle (which is a part of the recovery mode), threshold voltages vb1, ..., vb7 are applied to individual memory cells. As illustrated in FIG. 18, results of application of threshold voltage vb1 are used to construct bin histograms for the MSBs, results of application of threshold voltages vb2 and vb3 are used to construct bin histograms for the CSBs, and results of application of threshold voltages vb4, ..., vb7 are used to construct bin histograms for the LSBs.

In case the decoding operation after the second read cycle fails, the read module 26 performs a third read cycle that is associated with threshold voltages vc1, ..., vc7, as illustrated in FIG. 18. The read cycles are repeated until the iterative decoder 32 successfully decodes the data bits.

During the first, second, third (and subsequent, if necessary) read cycles, Rules 1, ..., 7 are used to assign LLRs to shortest bin histograms, split one or more bin histograms, assign LLRs to bin histograms that are neighboring to the shortest bin histograms, and/or the like, as previously disclosed.

Referring again to FIG. 17, the MSBs include only two possible PDF, and accordingly, estimating LLRs for MSBs for memory cells storing more than one data bit is similar to determining LLR for memory cells storing a single data bit.

Figure 19:
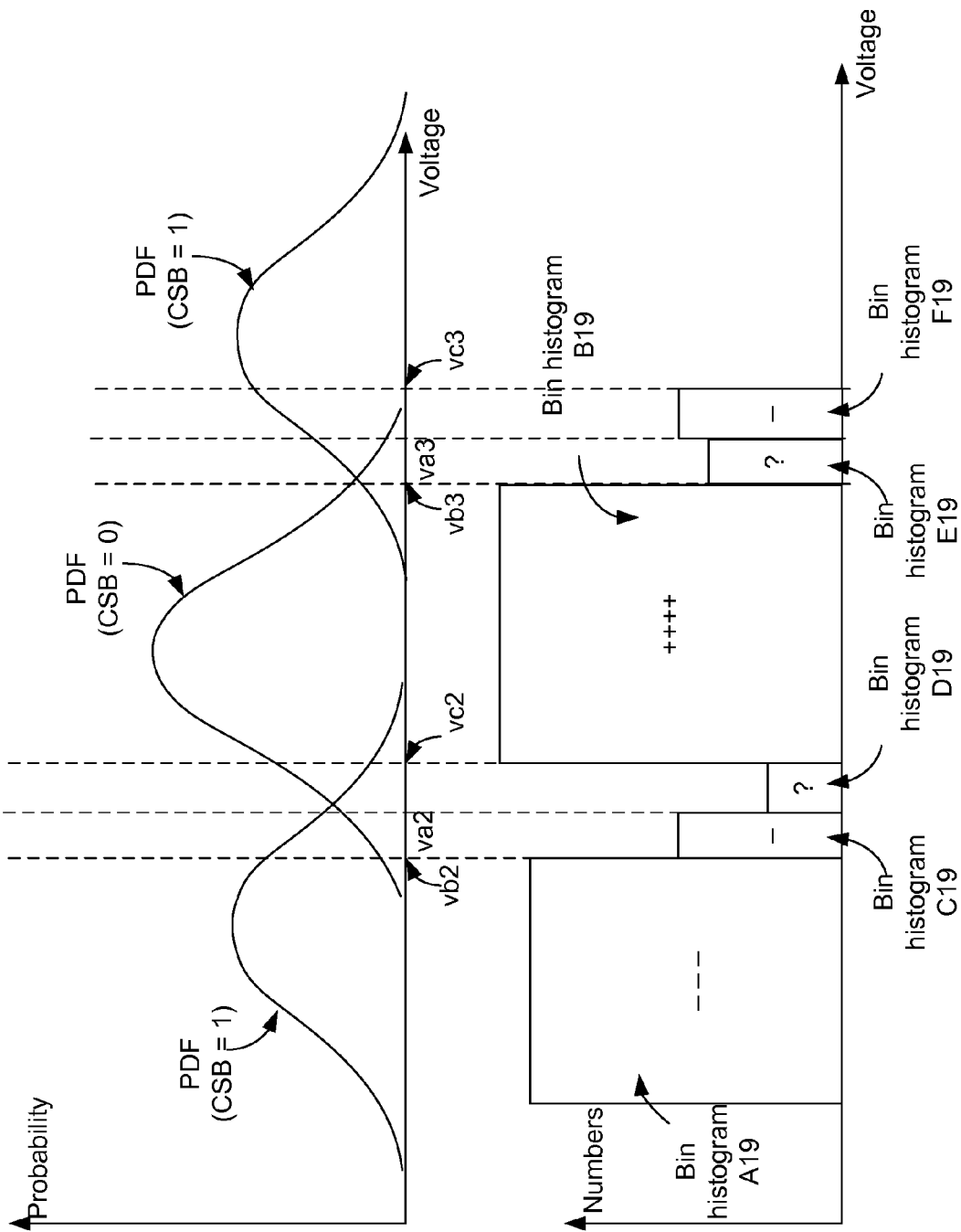
FIG. 19 illustrates, for memory cells storing three bit data, bin histograms for central significant bits (CSBs) corresponding to three read cycles.

However, the CSBs and LSBs in FIG. 17 wraps around. That is, for example, if a voltage level of a memory cell is higher than v16f or lower than v16b, the CSB stored in the memory cell is 1 with high probability. FIG. 19 illustrates, for memory cells storing three bit data, bin histograms for CSBs corresponding to three read cycles. The threshold voltages applied during the three read cycles (i.e., voltages va2, vb2, vc2, va3, vb3, and vc3) are similar to the applied threshold voltages in FIG. 18. If the voltage level of a memory cell is higher than vc3 or lower than vb2, the CSB stored in the memory cell is 1 with high probability. Accordingly, the bin histograms for these two possibilities are summed to form a single bin histogram A19. Various other bin histograms formed are B19, ..., F19. As formation of these bin histograms are self explanatory in view of previous discussions herein (e.g., discussions associated with FIG. 6), a detailed description of formation of these bin histograms are omitted herein for the sake of brevity.

In various embodiments, in FIG. 19, two different shortest bin histograms can be chosen: one associated with threshold voltages va2, vb2 and vc2, and another associated with threshold voltages va3, vb3 and vc3. For example, as illustrated in FIG. 19, bin histograms D19 and E19 are the two shortest bin histograms. These two shortest bin histograms are assigned LLRs, immediate neighboring bin histograms are assigned LLRs and/or one or more bin histograms are split during subsequent read cycles based at least in part on one or more of the previously discussed rules R1, ..., R7.

For example, it may be determined that the shortest bin histogram D19 is shorter than the threshold number of Rule 1, while the shortest bin histogram E19 is taller than the threshold number of Rule 1. In such a case, based on Rule 1, the shortest bin histogram D19 is assigned a zero LLR and the shortest bin histogram E19 is assigned a non-zero LLR (the magnitude and sign of which is based on Rule 2). Furthermore, if the three read cycles of FIG. 19 fails, based on Rules 3, ..., 5, a fourth read cycle (not illustrated in FIG. 19) splits the shortest bin histogram E19 (by applying a new threshold voltage that is between voltages vb3 and va3), whereas a fifth read cycle splits the bin histogram B19 (by applying a new threshold voltage that is slightly more than voltage vc2, as B19 is a relatively tall bin histogram neighboring the shortest bin histogram D19).

Figure 20:
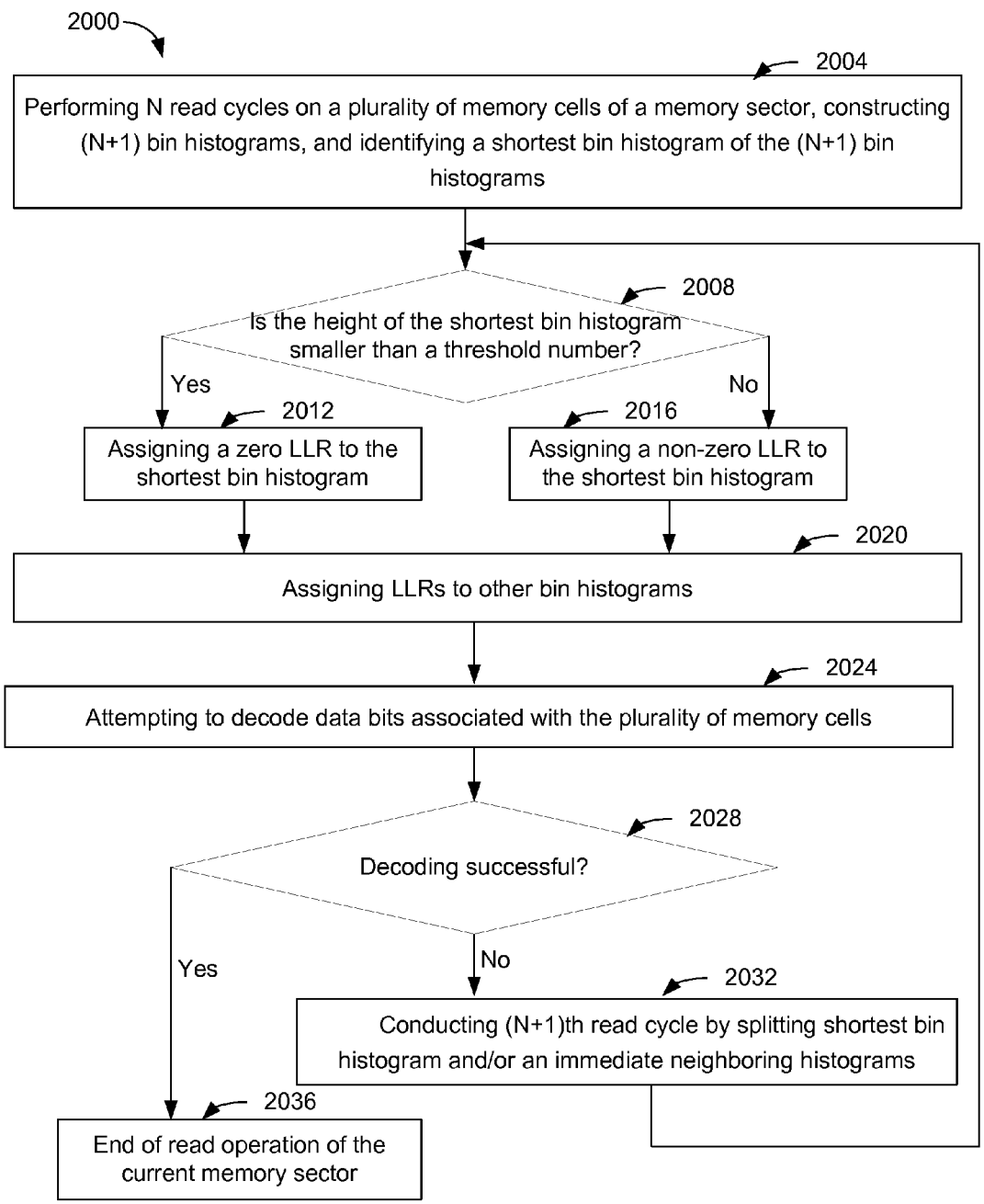
FIGS. 20 and 21 illustrate methods for operating the memory system of FIG. 1.

FIG. 20 illustrates an example of a method 2000 for operating the memory system 10 of FIG. 1. The method 2000 comprises, at 2004, performing (e.g., by the read module 26) N read cycles (e.g., 3 read cycles, as illustrated in FIG. 6) on a plurality of memory cells of a memory sector of the memory 24, constructing (N+1) bin histograms (e.g., bin histograms A6, ..., D6 of FIG. 6), and identifying a shortest bin histogram (e.g., shortest bin histogram D6) of the (N+1) bin histograms.

At 2008, the LLR determination module 28 makes a determination on whether the shortest bin histogram is smaller than a threshold number (e.g., the threshold number discussed with respect to Rule 1). If the shortest bin histogram is smaller than the threshold number, the shortest bin histogram is assigned a zero LLR based on Rule 1(i) of FIG. 7. If the shortest bin histogram is larger than the threshold number, the shortest bin histogram is assigned a non-zero LLR based on Rule 1(ii) of FIG. 7.

At 2020, the LLR determination module 28 assigns LLRs to other bin histograms (e.g., bin histograms A6, ..., C6 of FIG. 6) based at least in part on, for example, Rules 2 and 6 and Table 500 of FIG. 5.

At 2024, the iterative decoding module 32 attempts to decode data bits of the memory cells based at least in part on the assigned LLRs to the bin histograms. If, at 2028, the decoding is successful, the read operation of the current memory sector ends at 2036.

If, the decoding is unsuccessful at 2028, the read module 26 conducts a (N+1)th read cycle associated with a (N+1)th threshold voltage at 2032. During the (N+1)th read cycle, if a height of the shortest bin histogram is larger than the threshold number, the (N+1)th threshold voltage level splits the shortest bin histogram (e.g., based on Rule 3). On the other hand, if a height of the shortest bin histogram is smaller than the threshold number, the (N+1)th threshold voltage level splits an immediate neighboring bin histogram of the shortest bin histogram (e.g., based on Rules 4 and 5). The method then loops back to block 2028, where the height of the shortest bin histogram is again compared to the threshold number.

Figure 21:
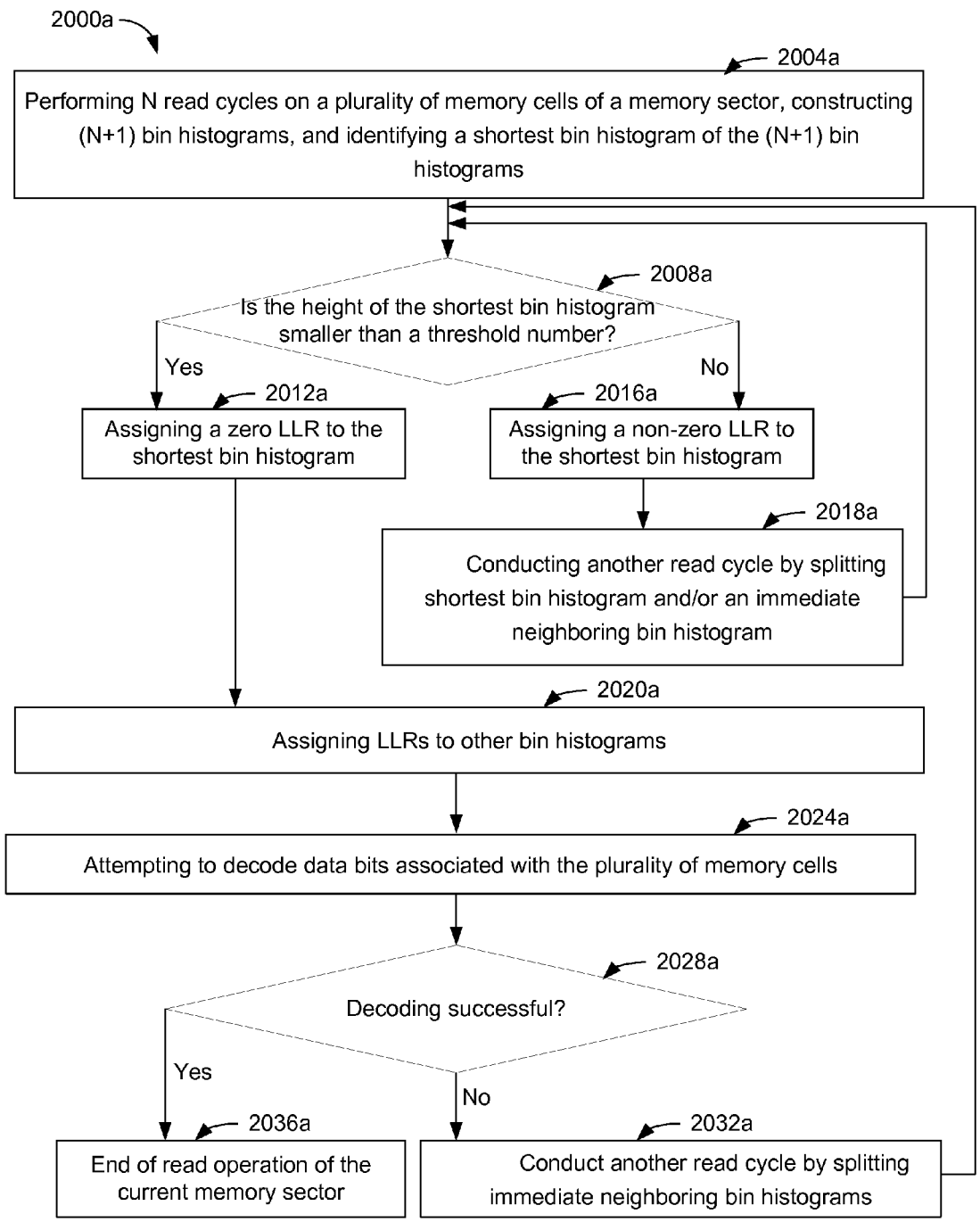

Although FIG. 20 illustrates performing the (N+1)th read cycle if the decoding fails, in various other embodiments, more than one read cycle may be performed and the shortest bin histogram may be split before attempting to decode the data bits. That is, once the memory system 10 enters the recovery mode, the read module 26 continues conducting one or more read cycles (without attempting to decode data bits in between these one or more read cycles) until, for example, the shortest bin histogram is smaller than the threshold number. After the shortest bin histogram becomes smaller than the threshold number, the iterative soft decoder 32 attempts to decode data bits. For example, FIG. 21 illustrates another example of a method 2000a for operating the memory system 10 of FIG. 1. Operations 2004, 2008, 2012a, 2016a, 2028a and 2036a of FIG. 21 are similar to corresponding operations of FIG. 20, and hence, these operations are not discussed in detail. However, unlike FIG. 20, in a case where the height of the shortest bin histogram is larger than the threshold number, at 2018a, the read module 26 conducts another read cycle by splitting the shortest bin histogram and/or an immediate neighboring bin histogram (e.g., based on Rules 3, 4 and 5). This goes on until the height of the shortest bin histogram is smaller than the threshold number. Once the height of the shortest bin histogram is smaller than the threshold number, decoding attempt is made at 2024a. If the decoding fails, at 2032a, another read cycle is conducted by splitting immediate neighboring bin histograms.

Although specific embodiments have been illustrated and described herein, a wide variety of alternate and/or equivalent implementations may be substituted for the specific embodiment illustrated and described without departing from the scope of the teachings of this disclosure. This disclosure covers all methods, apparatus, and articles of manufacture fairly falling within the scope of the appended claims either literally or under the doctrine of equivalents. This disclosure is intended to cover any adaptations or variations of the embodiments discussed herein.

What is claimed is:

1. A method comprising:
    performing N read cycles on a plurality of memory cells of a memory sector, wherein N is an integer greater than one;
    constructing (N+1) bin histograms based at least in part on performing the N read cycles;
    identifying a shortest bin histogram of the (N+1) bin histograms; and
    based on a height of the shortest histogram, assigning a log-likelihood ratio (LLR) to the shortest bin histogram.

2. The method of claim 1, wherein said assigning the LLR to the shortest bin histogram further comprises:
    if the height of the shortest bin histogram is smaller than a threshold number, assigning a zero log-likelihood ratio (LLR) to the shortest bin histogram; and
    if the height of the shortest bin histogram is larger than the threshold number, assigning a non-zero LLR to the shortest bin histogram.

3. The method of claim 2,
    wherein a first bin histogram and a second bin histogram are two immediate neighboring bin histograms of the shortest bin histogram, wherein the first bin histogram is taller compared to the second bin histogram, and
    wherein a magnitude of the non-zero LLR assigned to the shortest bin histogram is based on the height of the shortest bin histogram, wherein a sign of the non-zero LLR assigned to the shortest bin histogram is the same as a sign of the first bin histogram, and wherein the sign is assigned based at least in part on the first bin histogram being taller compared to the second bin histogram.

4. The method of claim 2,
    wherein there are X number of bin histograms to one side of the shortest bin histogram and Y number of bin histograms to another side of the shortest bin histogram, wherein X and Y are non-zero positive integers, wherein X is greater than Y,
    wherein a magnitude of the non-zero LLR assigned to the shortest bin histogram is based on the height of the shortest bin histogram, and
    wherein a sign of the non-zero LLR is assigned to the shortest bin histogram based at least in part on X being greater than Y.

5. The method of claim 1, wherein the N read cycles are associated with corresponding N threshold voltage levels, the method further comprising:
    estimating LLRs for each of the plurality of memory cells based at least in part on constructing the (N+1) bin histograms;
    attempting to decode data bits associated with the plurality of memory cells, based at least in part on the estimated LLRs; and
    in response to a failure in decoding the data bits, performing a (N+1)th read cycle on the plurality of memory cells.

6. The method of claim 5, wherein the shortest bin histogram is associated with a first threshold voltage level and a second threshold voltage level of the N threshold voltage levels, wherein the (N+1)th read cycle is associated with a (N+1)th threshold voltage level, and wherein performing the (N+1)th read cycle further comprises:
    if the height of the shortest bin histogram is larger than the threshold number, performing the (N+1)th read cycle such that the (N+1)th threshold voltage level is in between the first threshold voltage level and the second threshold voltage level.

7. The method of claim 5, wherein a first bin histogram and a second bin histogram are two immediate neighboring bin histograms of the shortest bin histogram, and wherein performing the (N+1)th read cycle further comprises:
    if a height of the shortest bin histogram is smaller than the threshold number, performing the (N+1)th read cycle such that the (N+1)th read cycle splits one of the first bin histogram and the second bin histogram.

8. The method of claim 7, wherein the (N+1)th read cycle splits the first bin histogram based at least in part on the first bin histogram being taller compared to the second bin histogram.

9. The method of claim 7,
    wherein the first bin histogram is the only bin histogram on one side of the shortest bin histogram, and
    wherein the (N+1)th read cycle splits the first bin histogram based at least in part on the first bin histogram being the only bin histogram on the one side of the shortest bin histogram.

10. The method of claim 1, wherein a first bin histogram is an immediate neighboring bin histogram of the shortest bin histogram, and wherein the method further comprises:
    estimating, based on a height of the first bin histogram, a first LLR that is to be assigned to the first bin histogram;
    determining that a ratio of heights of the first bin histogram and the shortest bin histogram exceeds a threshold ratio; and
    in response to determining that the ratio exceeds the threshold ratio, assigning a second LLR to the first bin histogram such that the second LLR is smaller in magnitude than a magnitude of the first LLR.

11. The method of claim 1, wherein a first bin histogram is an immediate neighboring bin histogram of the shortest bin histogram, wherein the method further comprises:
    estimating, based on a height of the first bin histogram, a first LLR that is to be assigned to the first bin histogram;
    determining that the first bin histogram is the only bin histogram to one side of the shortest bin histogram; and
    in response to determining that the first bin histogram is the only histogram to the one side of the shortest bin histogram, assigning a second LLR to the first bin histogram such that the second LLR is smaller in magnitude than a magnitude of the first LLR.

12. The method of claim 1, wherein the threshold number is equal to half of a syndrome size of an iterative decoder.

13. A memory system comprising:
a memory comprising a plurality of memory sectors, each sector including a plurality of memory cells;
a read module comprising a log-likelihood ratio (LLR) determination module; and
an iterative decoder;
wherein the LLR module is configured to:
   perform N read cycles on the plurality of memory cells of a first memory sector, wherein N is an integer and is greater than one,
   construct (N+1) bin histograms based at least in part on performing the N read cycles,
   identify a shortest bin histogram of the (N+1) bin histograms, and
   assign an LLR to the shortest bin histogram based at least in part on a height of the shortest bin histogram.

14. The memory system of claim 13, wherein the LLR module is further configured to:
assign a zero LLR to the shortest bin histogram, if the height of the shortest bin histogram is smaller than a threshold number, and
assign a non-zero LLR to the shortest bin histogram, if the height of the shortest bin histogram is larger than the threshold number.

15. The memory system of claim 14, wherein a first bin histogram and a second bin histogram are two immediate neighboring bin histograms of the shortest bin histogram, wherein the first bin histogram is taller compared to the second bin histogram, and wherein the LLR module is further configured to:
assign the non-zero LLR to the shortest bin histogram such that a magnitude of the non-zero LLR is based on the height of the shortest bin histogram, and a sign of the non-zero LLR is the same as a sign of the first bin histogram based at least in part on the first bin histogram being taller compared to the second bin histogram.

16. The memory system of claim 14,
wherein the LLR module is further configured to estimate LLRs for each of the plurality of memory cells of the first memory sector based at least in part on constructing the (N+1) bin histograms,
wherein iterative decoder is configured to attempt to decode data bits associated with the plurality of memory cells of the first memory sector, based at least in part on the estimated LLRs, and
wherein in response to a failure in decoding the data bits, the LLR module is further configured to perform a (N+1) th read cycle on the plurality of memory cells.

17. The memory system of claim 16,
wherein the shortest bin histogram is associated with a first threshold voltage level and a second threshold voltage level of the N threshold voltage levels, wherein the (N+1)th read cycle is associated with a (N+1)th threshold voltage level, and
wherein if the height of the shortest bin histogram is larger than the threshold number, the LLR module is further configured to perform the (N+1)th read cycle such that the (N+1)th threshold voltage level is in between the first threshold voltage level and the second threshold voltage level.

18. The memory system of claim 16,
wherein a first bin histogram and a second bin histogram are two immediate neighboring bin histograms of the shortest bin histogram, and
wherein if the height of the shortest bin histogram is smaller than the threshold number, the LLR module is further configured to perform the (N+1)th read cycle such that the (N+1)th read cycle splits one of the first bin histogram and the second bin histogram.

19. A method comprising:
performing N read cycles on a plurality of memory cells of a memory sector, wherein N is an integer and is greater than one,
constructing (N+1) bin histograms based at least in part on performing the N read cycles;
identifying a shortest bin histogram of the (N+1) bin histograms;
attempting to decode data bits associated with the plurality of memory cells, based at least in part on constructing the (N+1) bin histograms;
in response to a failure in decoding the data bits and if a height of the shortest bin histogram is larger than a threshold number, performing a (N+1)th read cycle on the plurality of memory cells such that a (N+1)th threshold voltage level, associated with the (N+1)th read cycle, splits the shortest bin histogram.

20. The method of claim 19, further comprising:
in response to a failure in decoding the data bits and if a height of the shortest bin histogram is smaller than a threshold number, performing the (N+1)th read cycle on the plurality of memory cells such that the (N+1)th threshold voltage level splits an immediate neighboring bin histogram of the shortest bin histogram.

* * * * *